US012696811B2

(12) United States Patent
Lee et al.

(10) Patent No.: US 12,696,811 B2
(45) Date of Patent: Jul. 28, 2026

(54) SEMICONDUCTOR PACKAGE

(71) Applicant: Samsung Electronics Co., Ltd.,
Suwon-si (KR)

(72) Inventors: Won Il Lee, Suwon-si (KR);
Hyungchul Shin, Suwon-si (KR);
Gwangjae Jeon, Suwon-si (KR); **Enbin
Jo**, Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 513 days.

(21) Appl. No.: 18/326,554

(22) Filed: May 31, 2023

(65) Prior Publication Data

US 2024/0072006 A1      Feb. 29, 2024

(30) Foreign Application Priority Data

Aug. 26, 2022    (KR) ........................ 10-2022-0107858

(51) Int. Cl.
H01L 23/00       (2006.01)
H10W 70/65       (2026.01)
H10W 90/00       (2026.01)
H10W 90/20       (2026.01)

(52) U.S. Cl.
CPC ........... H10W 90/00 (2026.01); H10W 70/65
(2026.01); *H10W 90/297* (2026.01); *H10W*
*90/792* (2026.01)

(58) Field of Classification Search
CPC .. H01L 23/49838; H01L 24/08; H10W 90/00;
H10W 70/65
See application file for complete search history.

(56) References Cited

U.S. PATENT DOCUMENTS

| | | | | |
|---|---|---|---|---|
| 7,563,694 | B2 | 7/2009 | Burnside et al. | |
| 9,406,625 | B2 | 8/2016 | Wang et al. | |
| 10,692,826 | B2 | 6/2020 | Wei et al. | |
| 10,861,808 | B2 | 12/2020 | Chen et al. | |
| 11,742,271 | B2 * | 8/2023 | Kang .................. | H10W 70/685 |
| | | | | 257/738 |
| 12,057,404 | B2 * | 8/2024 | Jo ....................... | H10W 70/611 |

(Continued)

FOREIGN PATENT DOCUMENTS

| | | |
|---|---|---|
| KR | 10-2016-0025280 A | 3/2016 |
| KR | 102205746 B1 | 1/2021 |
| KR | 10-2021-0082030 A | 7/2021 |

*Primary Examiner* — Dale E Page
*Assistant Examiner* — Wilner Jean Baptiste

(57) ABSTRACT

A semiconductor package includes a first semiconductor chip including a first main region and a first edge region, and a second semiconductor chip on the first semiconductor chip and including a second main region and a second edge region. The first semiconductor chip includes a first main pad and a first dummy pad respectively on the first main region and the first edge region on a top surface of the first semiconductor chip. The second semiconductor chip includes a first semiconductor substrate, a wiring layer below the first semiconductor substrate and including a wiring dielectric layer and wiring patterns, a second main pad and a second dummy pad respectively on the second main region and the second edge region below the wiring layer. A thickness of the wiring layer is greater on the second main region than on the second edge region.

20 Claims, 23 Drawing Sheets

(56)         References Cited

U.S. PATENT DOCUMENTS

| | | | |
|---|---|---|---|
| 2011/0316167 A1* | 12/2011 | McConnelee | H01L 23/49805 |
| | | | 174/262 |
| 2014/0054761 A1* | 2/2014 | Lin | H01L 23/42 |
| | | | 257/692 |
| 2015/0255417 A1 | 9/2015 | Farooq et al. | |
| 2020/0411476 A1 | 12/2020 | Chen et al. | |
| 2022/0013502 A1* | 1/2022 | Lee | H01L 24/06 |
| 2022/0037273 A1 | 2/2022 | Park et al. | |

* cited by examiner

FIG. 19

SEMICONDUCTOR PACKAGE

CROSS-REFERENCE TO RELATED APPLICATION

This U.S. nonprovisional application claims priority under 35 U.S.C § 119 to Korean Patent Application No. 10-2022-0107858, filed on Aug. 26, 2022 in the Korean Intellectual Property Office, the disclosure of which is hereby incorporated by reference in its entirety.

BACKGROUND

The present inventive concepts relate to a directly bonded semiconductor device and a method of fabricating the same.

In the semiconductor industry, high capacity, thinness, and small size of semiconductor devices and electronic products using the same have been demanded and thus various package techniques have been suggested. One approach of the various package techniques is a packaging technique which vertically stacks a plurality of semiconductor chips to achieve a high density chip stacking. This packaging technique has an advantage in that it is capable of integrating semiconductor chips having various functions on a small area as compared to a conventional package consisting of one semiconductor chip.

A semiconductor package can be provided to implement an integrated circuit chip to be suitable for use in electronic products. A semiconductor package is typically configured such that a semiconductor chip is mounted on a printed circuit board and bonding wires or bumps are used to electrically connect the semiconductor chip to the printed circuit board. With the development of electronic industry, various research has been conducted to improve reliability and durability of semiconductor packages.

SUMMARY

Some embodiments of the present inventive concepts provide a semiconductor package with increased reliability.

According to some embodiments of the present inventive concepts, a semiconductor package may include: a first semiconductor chip including a first main region and a first edge region that surrounds the first main region, the first main region being on a central area of the first semiconductor chip (e.g., when viewed in plan); and a second semiconductor chip on the first semiconductor chip, the second semiconductor chip including a second main region and a second edge region that surrounds the second main region, the second main region being on a central area of the second semiconductor chip (e.g., when viewed in plan). The first semiconductor chip may include: a first main pad on a top surface of the first semiconductor chip on the first main region; and a first dummy pad on the top surface of the first semiconductor chip on the first edge region. The second semiconductor chip may include: a first semiconductor substrate; a wiring layer below the first semiconductor substrate, the wiring layer including a wiring dielectric layer and wiring patterns; a second main pad below the wiring layer on the second main region; and a second dummy pad below the wiring layer on the second edge region. A thickness of the wiring layer on the second main region may be greater than a thickness of the wiring layer on the second edge region.

According to some embodiments of the present inventive concepts, a semiconductor package may include a first semiconductor chip including a first main region and a first edge region that surrounds the first main region. The first main region may be on a central area of the first semiconductor chip when viewed in plan. The first semiconductor chip may include: a semiconductor substrate; a wiring layer below the semiconductor substrate, the wiring layer including a wiring dielectric layer and wiring patterns; lower main pads on the first main region and below the wiring layer; lower dummy pads on the first edge region and below the wiring layer; and an edge pattern on the first edge region and between the wiring layer and the lower dummy pads. A lowermost surface of the wiring layer may be at a vertical level lower than a vertical level of a bottom surface of the edge pattern. The edge pattern may be vertically spaced apart from the lower dummy pads. A first spacing may be a distance between neighboring ones of the lower main pads. A second spacing may be a distance between neighboring ones of the lower dummy pads. The second spacing may be about 0.5 times to about 1.5 times the first spacing.

According to some embodiments of the present inventive concepts, a semiconductor package may include: a main board; an interposer on the main board; a stack structure on the interposer, the stack structure including a plurality of first semiconductor chips that are vertically stacked; and a second semiconductor chip on the interposer and adjacent a side surface of the stack structure. Each of the first semiconductor chips may include: a semiconductor substrate including a main region on a central area of the first semiconductor chip and an edge region that surrounds the main region (e.g., when viewed in plan); a first dielectric layer, a second dielectric layer, and a third dielectric layer that are sequentially stacked on a top surface of the semiconductor substrate; an upper main pad on the top surface of the semiconductor substrate on the main region; a lower main pad on a bottom surface of the semiconductor substrate on the main region; an upper dummy pad on the top surface of the semiconductor substrate on the edge region; and a lower dummy pad on the bottom surface of the semiconductor substrate on the edge region. A thickness of the first dielectric layer and a thickness of the third dielectric layer may be greater than a thickness of the second dielectric layer. The second dielectric layer may include a dielectric material having an etch selectivity with respect to the first dielectric layer and the third dielectric layer. A bottom surface of the upper main pad and a bottom surface of the upper dummy pad may be at a higher vertical level than a bottom surface of the second dielectric layer.

BRIEF DESCRIPTION OF THE DRAWINGS

FIG. 19 illustrates a cross-sectional view showing a semiconductor package according to some embodiments of the present inventive concepts.

DETAILED DESCRIPTION

Some embodiments of the present inventive concepts will now be described in detail with reference to the accompanying drawings to aid in clearly explaining the present inventive concepts.

Figure 1:
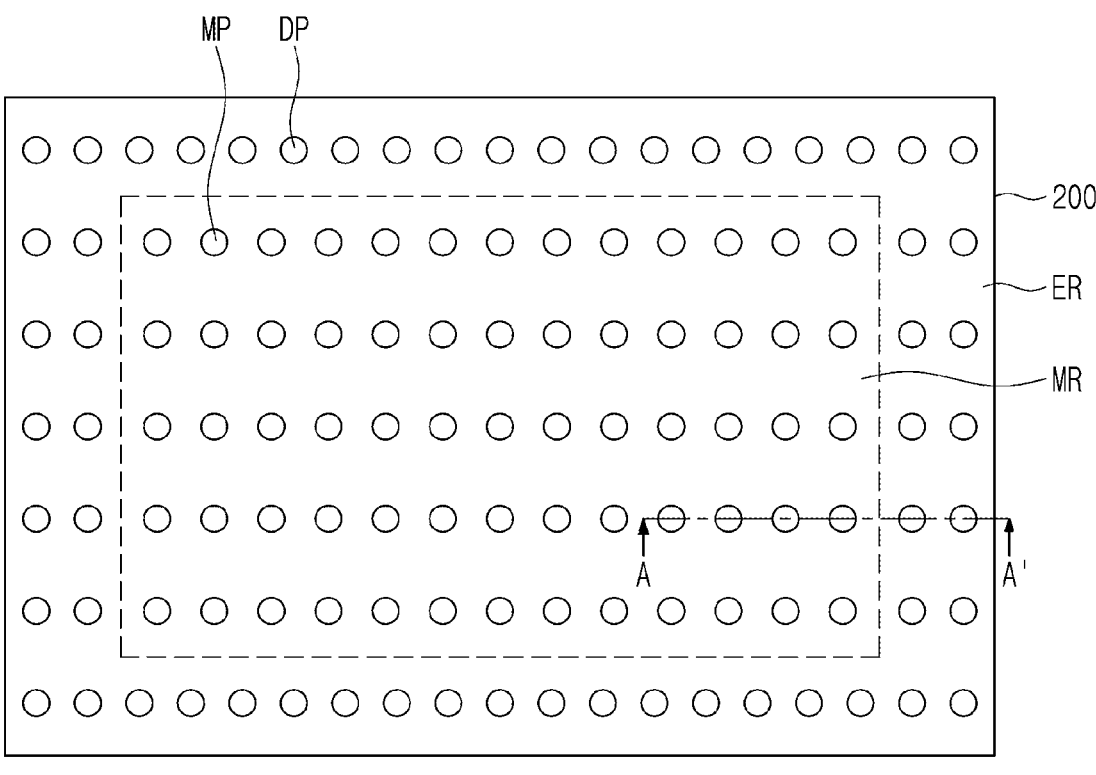
FIG. 1 illustrates a plan view showing a semiconductor package according to some embodiments of the present inventive concepts.
Figure 1:
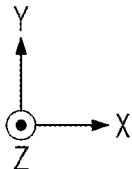
Figure 2:
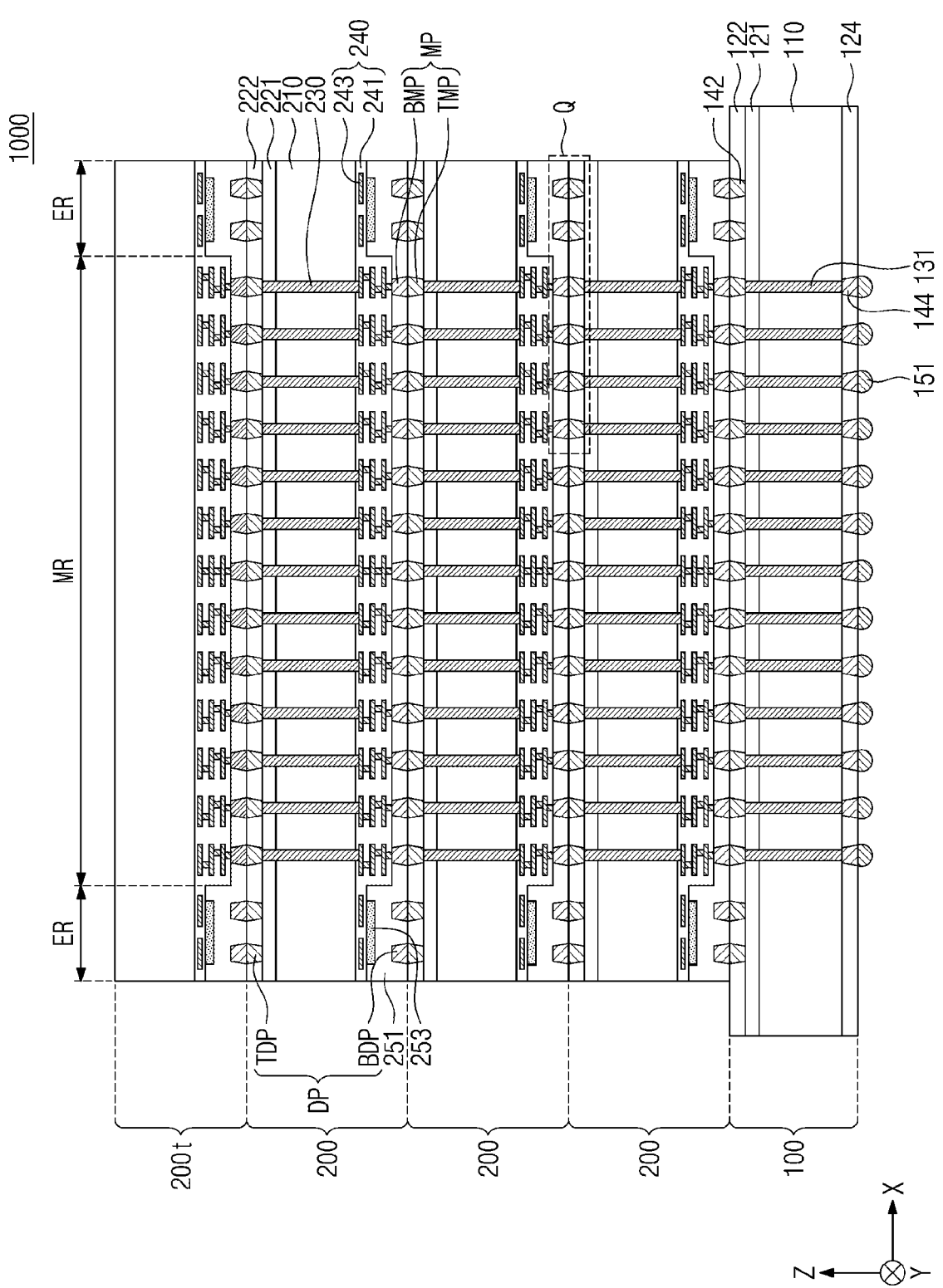
FIG. 2 illustrates a cross-sectional view showing a semiconductor package according to some embodiments of the present inventive concepts.

FIG. 1 illustrates a plan view showing a semiconductor package according to some embodiments of the present inventive concepts. FIG. 2 illustrates a cross-sectional view showing a semiconductor package according to some embodiments of the present inventive concepts.

Referring to FIGS. 1 and 2, a semiconductor package 1000 may include a buffer chip 100 and a plurality of first semiconductor chips 200 and 200t.

The buffer chip 100 may include, for example, a logic chip. The buffer chip 100 may be disposed on an lower portion of the semiconductor package 1000, and may integrate and outwardly transfer signals of the first semiconductor chips 200 and 200t or may transfer external signals and power to the first semiconductor chips 200 and 200t which will be discussed below. The buffer chip 100 may be called a control chip.

The buffer chip 100 may include a buffer substrate 110, a first buffer dielectric layer 121, a second buffer dielectric layer 122, a third buffer dielectric layer 124, a first through via 131, a first upper pad 142, a first lower pad 144, and an external connection terminal 151.

The buffer substrate 110 may be, for example, a silicon substrate, a silicon-germanium substrate, a germanium substrate, or a monocrystalline epitaxial layer grown on a monocrystalline silicon substrate. Additionally or alternatively, the buffer substrate 110 may include a compound semiconductor, such as silicon carbide (SiC), gallium arsenide (GaAs), indium arsenide (InAs), or indium phosphide (InP).

The first buffer dielectric layer 121 may be provided on a top surface of the buffer substrate 110. The second buffer dielectric layer 122 may be provided on a top surface of the first buffer dielectric layer 121. The third buffer dielectric layer 124 may be provided on a bottom surface of the buffer substrate 110. The first, second, and third buffer dielectric layers 121, 122, and 124 may each include a dielectric material. For example, each of the first, second, and third buffer dielectric layers 121, 122, and 124 may include one or more of silicon oxide, silicon nitride, silicon oxynitride, and low-k dielectric materials.

In this description, a first direction X may be defined to indicate a direction that is parallel to the top surface of the buffer substrate 110, a second direction Y may be defined to indicate a direction that is parallel to the top surface of the buffer substrate 110 and intersects or is perpendicular to the first direction X, and a third direction Z may be defined to indicate a direction that is perpendicular to the top surface of the buffer substrate 110. In this description, unless otherwise specified, the language "perpendicular/vertical" denotes a direction the same as the third direction Z.

The first through via 131 may be provided to penetrate the buffer substrate 110 and the first buffer dielectric layer 121. The first through via 131 may be a through silicon via (TSV). The first through via 131 may be provided in plural. The plurality of first through vias 131 may be spaced apart from each other in the first direction X or the second direction Y.

Unless otherwise specified, a description of one first through via 131 may be applicable to all of the plurality of first through vias 131.

The first buffer dielectric layer 121 may not cover a top surface of the first through via 131. For example, the first buffer dielectric layer 121 may expose the top surface of the first through via 131. The top surface of the first through via 131 may be coplanar with that of the first buffer dielectric layer 121. The third buffer dielectric layer 124 may not cover a bottom surface of the first through via 131. For example, the third buffer dielectric layer 124 may expose the bottom surface of the first through via 131.

The first through via 131 may include a barrier layer on an outer surface thereof and a buried conductive layer in an inside thereof. The barrier layer may include at least one selected from Ti, TiN, Ta, TaN, Ru, Co, Mn, WN, Ni, and NiB. The buried conductive layer may include at least one selected from Cu, CuSn, CuMg, CuNi, CuZn, CuPd, CuAu, CuRe, CuW, any alloy of Cu, W, any alloy of W, Ni, Ru, and Co.

The first upper pad 142 may be provided on the top surface of the first buffer dielectric layer 121. The first upper pad 142 may be provided in plural. The plurality of first upper pads 142 may be spaced apart from each other in the first direction X or the second direction Y.

Unless otherwise specified, a description of one first upper pad 142 may be applicable to all of the plurality of first upper pads 142.

One of the first upper pads 142 may be disposed on a central portion to vertically overlap or align with the first through via 131. When viewed in plan, another of the first upper pads 142 may be provided on a peripheral portion of the buffer substrate 110 and may not vertically overlap or align with the first through via 131. The second buffer dielectric layer 122 may cover or surround opposite lateral or side surfaces of the first upper pad 142. The second buffer dielectric layer 122 may not cover a top surface of the first upper pad 142. The top surface of the first upper pad 142 may be coplanar with that of the second buffer dielectric layer 122.

Unless otherwise specified, in this description, the phrase "components are connected to each other" may include all of the meaning that components are electrically connected to each other, the meaning that components are connected through direct contact to each other, and the meaning that components are indirectly connected to each other across other element(s).

The one of the first upper pads 142 on the central portion may be connected to the first through via 131. The another of the first upper pads 142 on the peripheral portion may not be connected to the first through via 131. The first upper pad 142 may include at least one selected from, for example, aluminum (Al), copper (Cu), nickel (Ni), tungsten (W), platinum (Pt), and gold (Au).

The first lower pad 144 may be provided on the bottom surface of the buffer substrate 110. The first lower pad 144 may be provided in plural. The plurality of first lower pads 144 may be spaced apart from each other in the first direction X or the second direction Y.

Unless otherwise specified, a description of one first lower pad 144 may be applicable to all of the plurality of first lower pads 144.

The first lower pad 144 may vertically overlap or align with the first through via 131. The first lower pad 144 may be connected to the first through via 131. The first lower pad 144 may include at least one selected from, for example, aluminum (Al), copper (Cu), nickel (Ni), tungsten (W), platinum (Pt), and gold (Au).

The external connection terminal 151 may be provided below the first lower pad 144. The external connection terminal 151 may be provided in plural. The plurality of external connection terminals 151 may be spaced apart from each other in the first direction X or the second direction Y.

Unless otherwise specified, a description of one external connection terminal 151 may be applicable to all of the plurality of external connection terminals 151.

The external connection terminal 151 may include at least one selected from solder, pillars, and bumps. The external connection terminal 151 may include a conductive metallic material. The external connection terminal 151 may include at least one selected from, for example, tin (Sn), lead (Pb), nickel (Ni), gold (Au), silver (Ag), copper (Cu), aluminum (Al), and bismuth (Bi).

A plurality of first semiconductor chips 200 and 200t may be provided on the buffer chip 100. The first semiconductor chips 200 and 200t may be vertically stacked. Each of the first semiconductor chips 200 and 200t may include a volatile memory semiconductor chip such as dynamic random access memory (DRAM) and static random access memory (SRAM), or a nonvolatile memory device such as phase change random access memory (PRAM), magnetic random access memory (MRAM), ferroelectric random access memory (FeRAM), and resistive random access memory (RRAM). In the semiconductor package 1000 of the present embodiment, the first semiconductor chips 200 and 200t may be a high bandwidth memory (HBM) chip including DRAMs. Therefore, the semiconductor package 1000 of the present embodiment may be an HBM package. The first semiconductor chips 200 and 200t may include the same type memory chip.

Unless otherwise specified, a description of one first semiconductor chip 200 may be applicable to all of the plurality of first semiconductor chips 200 and 200t.

The first semiconductor chip 200 may include a first semiconductor substrate 210, a first dielectric layer 221, a second dielectric layer 222, a second through via 230, a wiring layer 240, an edge pattern 253, a third dielectric layer 251, main pads MP, and dummy pads DP. When viewed in plan, the first semiconductor chip 200 may be provided in the buffer chip 100. For example, a width in the first direction X of the first semiconductor chip 200 may be less than a width in the first direction X of the buffer chip 100, and a width in the second direction Y of the first semiconductor chip 200 may be less than a width in the second direction Y of the buffer chip 100. When viewed in plan as shown in FIG. 1, the first semiconductor chip 200 may include a main or central region MR disposed on a central area thereof and an edge or peripheral region ER that surrounds the main region MR. The main region MR may be a zone where memory devices are present in the first semiconductor chip 200. The edge region ER may be a scribe lane area. The edge region ER may be a scribe lane that remains without being cut when a dicing or sawing process is performed on a wafer that has experienced front-end and rear-end processes. The edge region ER of the first semiconductor chip 200 may include patterns such as one or more of a photo alignment mark, an overlay mark, and direct current test element group (DC TEG) for performing an inspection, measurement, characteristics verification, and so forth. For example, the main region MR and the edge region ER of the first semiconductor chip 200 may include their patterns that are formed to have different structures from each other.

The first semiconductor substrate 210 may be a silicon substrate, a silicon-germanium substrate, a germanium substrate, or a monocrystalline epitaxial layer grown on a monocrystalline silicon substrate. Additionally or alternatively, the first semiconductor substrate 210 may include a compound semiconductor, such as silicon carbide (SiC), gallium arsenide (GaAs), indium arsenide (InAs), or indium phosphide (InP).

The first dielectric layer 221 may be provided on the first semiconductor substrate 210 (e.g., on a top surface of the first semiconductor substrate 210). The second dielectric layer 222 may be provided on the first dielectric layer 221 (e.g., on a top surface of the first dielectric layer 221). The first and second dielectric layers 221 and 222 may each include a dielectric material. For example, each of the first and second dielectric layers 221 and 222 may include one or more of silicon oxide and low-k dielectric materials. The first and second dielectric layers 221 and 222 may include the same or different materials.

The second through via 230 may be provided to penetrate the first semiconductor substrate 210 and the first dielectric layer 221. The second through via 230 may be a through silicon via (TSV). The second through via 230 may be provided in plural. The plurality of second through vias 230 may be spaced apart from each other in the first direction X or the second direction Y.

Unless otherwise specified, a description of one second through via 230 may be applicable to all of the plurality of second through vias 230.

The first dielectric layer 221 may not cover a top surface of the second through via 230. The top surface of the second through via 230 may be coplanar with that of the first dielectric layer 221. The second through via 230 may include a barrier layer on an outer surface thereof and a buried conductive layer in an inside thereof. The barrier layer may include at least one selected from Ti, TiN, Ta, TaN, Ru, Co, Mn, WN, Ni, and NiB. The buried conductive layer may include at least one selected from Cu, CuSn, CuMg, CuNi, CuZn, CuPd, CuAu, CuRe, CuW, any alloy of Cu, W, any alloy of W, Ni, Ru, and Co.

The wiring layer 240 may be provided on a bottom surface of the first semiconductor substrate 210. The wiring layer 240 may include a wiring dielectric layer 241 and first wiring patterns 243. A thickness in the third direction Z of the wiring layer 240 may be different on the main region MR and the edge region ER. For example, the wiring layer 240 may have a step difference or be stepped on a boundary between the main region MR and the edge region ER. A thickness of the wiring layer 240 on the edge region ER may be less than that of the wiring layer 240 on the main region MR. In this case, the thickness of the wiring layer 240 on the main region MR may be greater than that of the wiring layer 240 on the edge region ER. Therefore, a thickness in the third direction Z of a subsequently described third dielectric layer 251 on the edge region ER may be greater than that in the third direction Z of the third dielectric layer 251 on the main region MR. For example, the third dielectric layer 251 may have a step difference or be stepped on a boundary between the main region MR and the edge region ER.

The wiring dielectric layer 241 may include a dielectric material. For example, the wiring dielectric layer 241 may include one or more of silicon oxide, silicon nitride, silicon oxynitride, and low-k dielectric materials. The first wiring patterns 243 may include a conductive material. The first wiring patterns 243 may include, for example, one of Cu, W, Ni, Co, and any alloy thereof.

The second through via 230 may further penetrate a portion of the wiring dielectric layer 241. The second through via 230 may be connected to the first wiring patterns 243.

On the edge region ER, the edge pattern 253 may be provided below the wiring layer 240. As discussed above, the edge pattern 253 may be one or more of a photo alignment mark, an overlay mark, and direct current test element group (DC TEG) for performing an inspection, measurement, characteristics verification, and so forth. For example, the edge pattern 253 may have a cross shape when viewed in plan. For another example, the edge pattern 253 may have a circular or polygonal shape when viewed in plan. When viewed in vertical section, the edge pattern 253 may have a protrusion that protrudes downwardly. Alternatively, when viewed in vertical section, the edge pattern 253 may have a part that is recessed upwardly. The present inventive concepts, however, are not limited thereto, and the edge pattern 253 may have planar and vertical shapes that are variously changed based on purpose.

For example, a bottom surface of the edge pattern 253 may be located at a vertical level higher than that of a lowermost surface of the wiring layer 240. In this case, the lowermost surface of the wiring layer 240 may be located at a vertical level lower than that of the bottom surface of the edge pattern 253. The edge pattern 253 may be spaced apart in a vertical direction from a lower dummy pad BDP which will be discussed below.

The third dielectric layer 251 may be provided below the wiring layer 240 (e.g., on a bottom surface of the wiring layer 240). The third dielectric layer 251 may cover the edge pattern 253 and the wiring layer 240. The third dielectric layer 251 may include a dielectric material. For example, the third dielectric layer 251 may include one or more of silicon oxide, silicon nitride, silicon oxynitride, and low-k dielectric materials.

The main or central pads MP may be provided on the main region MR of the first semiconductor chip 200. The main pads MP may include an upper or top main pad TMP and a lower or bottom main pad BMP.

The upper main pad TMP may be provided on the first dielectric layer 221. The upper main pad TMP may be provided in plural. The plurality of upper main pads TMP may be spaced apart from each other in the first direction X or the second direction Y.

Unless otherwise specified, a description of one upper main pad TMP may be applicable to all of the plurality of upper main pads TMP.

The upper main pad TMP may be connected to the second through via 230. The second dielectric layer 222 may not cover a top surface of the upper main pad TMP. The top surface of the upper main pad TMP may be coplanar with that of the second dielectric layer 222. The second dielectric layer 222 may cover or surround opposite lateral or side surfaces of the upper main pad TMP. The upper main pad TMP may have a width in the first direction X or the second direction Y, and the width of the upper main pad TMP may decrease in a direction from the top toward bottom surfaces of the upper main pad TMP.

The lower main pad BMP may be provided below the wiring layer 240. The lower main pad BMP may be provided in plural. The plurality of lower main pads BMP may be spaced apart from each other in the first direction X or the second direction Y.

Unless otherwise specified, a description of one lower main pad BMP may be applicable to all of the plurality of lower main pads BMP.

The lower main pad BMP may be connected to the first wiring patterns 243. The third dielectric layer 251 may not cover a bottom surface of the lower main pad BMP. The third dielectric layer 251 may cover or surround opposite lateral or side surfaces of the lower main pad BMP. The bottom surface of the lower main pad BMP may be coplanar with that of the third dielectric layer 251. The lower main pad BMP may have a width in the first direction X or the second direction Y, and the width of the lower main pad BMP may decrease in a direction from the bottom toward top surfaces of the lower main pad BMP.

The dummy pads DP may be provided on the edge region ER of the first semiconductor chip 200. The dummy pads DP may include an upper or top dummy pad TDP and a lower or bottom dummy pad BDP.

The upper dummy pad TDP may be provided on the first dielectric layer 221. The upper dummy pad TDP may be provided in plural. The plurality of upper dummy pads TDP may be spaced apart from each other in the first direction X or the second direction Y.

Unless otherwise specified, a description of one upper dummy pad TDP may be applicable to all of the plurality of upper dummy pads TDP.

The upper dummy pad TDP may not be connected to the second through via 230. The second dielectric layer 222 may not cover a top surface of the upper dummy pad TDP. The top surface of the upper dummy pad TDP may be coplanar with that of the second dielectric layer 222. For example, the top surface of the upper dummy pad TDP may be coplanar with that of the upper main pad TMP. The second dielectric layer 222 may cover or surround opposite lateral or side surfaces of the upper dummy pad TDP. The upper dummy pad TDP may have a width in the first direction X or the second direction Y, and the width of the upper dummy pad TDP may decrease in a direction from the bottom toward top surfaces of the upper dummy pad TDP.

The lower dummy pad BDP may be provided below the wiring layer 240. The lower dummy pad BDP may be provided in plural. The plurality of lower dummy pads BDP may be spaced apart from each other in the first direction X or the second direction Y.

Unless otherwise specified, a description of one lower dummy pad BDP may be applicable to all of the plurality of lower dummy pads BDP.

The lower dummy pad BDP may be connected to none of the first wiring patterns 243. The third dielectric layer 251 may not cover a bottom surface of the lower dummy pad BDP. The third dielectric layer 251 may cover or surround opposite lateral or side surfaces of the lower dummy pad BDP. The bottom surface of the lower dummy pad BDP may be coplanar with that of the third dielectric layer 251. For example, the bottom surface of the lower dummy pad BDP may be coplanar with that of the lower main pad BMP. The lower dummy pad BDP may have a width in the first direction X or the second direction Y, and the width of the lower dummy pad BDP may decrease in a direction from the bottom toward top surfaces of the lower dummy pad BDP.

A minimum vertical distance from the lower main pad BMP to the first wiring patterns 243 on the main region MR may be less than that from the lower dummy pad BDP to the first wiring patterns 243 on the edge region ER. This may be caused by the fact that the thickness of the wiring layer 240 on the main region MR is greater than the thickness of the wiring layer 240 on the edge region ER.

Unlike the first semiconductor chip 200, an uppermost first semiconductor chip 200t of the first semiconductor chips 200 and 200t may not include any of the first dielectric layer 221, the second dielectric layer 222, the second through via 230, the upper main pad TMP, and the upper dummy pad TDP. The first semiconductor chips 200 and 200t will be expressed below as the first semiconductor chips 200.

Figure 3:
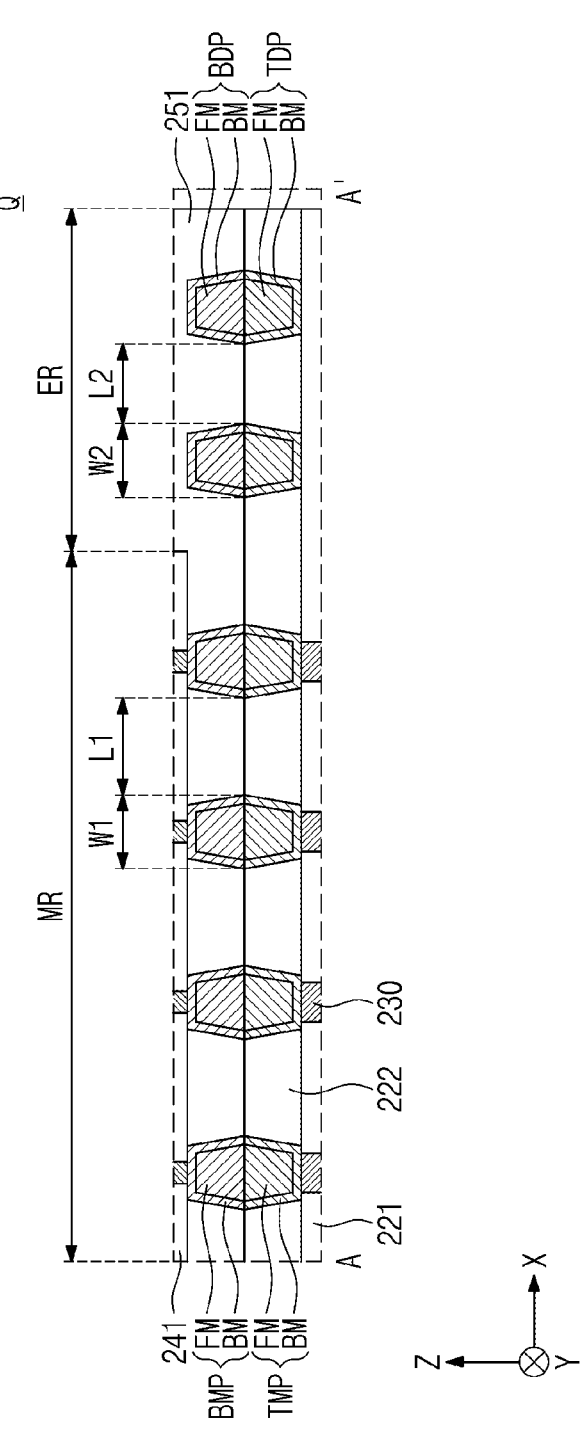
FIG. 3 illustrates an enlarged cross-sectional view showing section Q of FIG. 2 taken along line A-A' of FIG. 1.

FIG. 3 illustrates an enlarged cross-sectional view showing section Q of FIG. 2 taken along line A-A' of FIG. 1.

Referring to FIG. 3, the upper main pad TMP, the lower main pad BMP, the upper dummy pad TDP, and the lower dummy pad BDP may each include a conductive pattern FM and a barrier pattern BM. The barrier pattern BM may expose one of top and bottom surfaces of the conductive pattern FM. For example, the barrier pattern BM of the upper main pad TMP may expose the top surface of the conductive pattern FM of the upper main pad TMP, and the barrier pattern BM of the upper dummy pad TDP may expose the top surface of the conductive pattern FM of the upper dummy pad TDP. The barrier pattern BM of the lower main pad BMP may expose the bottom surface of the conductive pattern FM of the lower main pad BMP, and the barrier pattern BM of the lower dummy pad BDP may expose the bottom surface of the conductive pattern FM of the lower dummy pad BDP.

The conductive pattern FM may include a metallic material. The conductive pattern FM may include, for example, Cu, Al, Co, Ru, or any alloy thereof. The barrier pattern BM may include, for example, at least one selected from Ti, Ta, TiN, and TaN. The main pads MP and the dummy pads DP may include the same material.

In the semiconductor package 1000 according to the present inventive concepts, the main pads MP and the dummy pads DP may include the same material. Therefore, the dummy pads DP may be formed by changing only a reticle without requiring any additional steps in a typical photolithography process. Accordingly, it may be possible to reduce fabrication time and cost for fabricating the semiconductor package 1000.

Referring back to FIG. 3, the upper main pad TMP included in a lower one of two adjacent first semiconductor chips 200 may be in at least partial contact with the lower main pad BMP included in an upper one of two adjacent first semiconductor chips 200. The conductive pattern FM of the upper main pad TMP may be in at least partial contact with the conductive pattern FM of the lower main pad BMP. The barrier pattern BM of the upper main pad TMP may be in at least partial contact with the barrier pattern BM of the lower main pad BMP. In an embodiment, the upper main pad TMP and the lower main pad BMP may be symmetric with each other about a top surface of the lower one of two adjacent first semiconductor chips 200.

The upper dummy pad TDP included in the lower one of two adjacent first semiconductor chips 200 may be in at least partial contact with the lower dummy pad BDP included in the upper one of two adjacent first semiconductor chips 200. The conductive pattern FM of the upper dummy pad TDP may be in at least partial contact with the conductive pattern FM of the lower dummy pad BDP. The barrier pattern BM of the upper dummy pad TDP may be in at least partial contact with the barrier pattern BM of the lower dummy pad BDP. In an embodiment, the upper dummy pad TDP and the lower dummy pad BDP may be symmetric with each other about the top surface of the lower one of two adjacent first semiconductor chips 200.

In the semiconductor package 1000 according to the present inventive concepts, each of the first semiconductor chips 200 sequentially stacked may include the dummy pads DP on the edge region ER. As the dummy pads DP cause the main region MR and the edge region ER to have their metal densities similar to each other, when a planarization process (e.g., CMP) is performed on the first semiconductor chip 200 to form the main pads MP, a CMP removal rate on the main region MR may be substantially the same as that on the edge region ER. Accordingly, the creation of void may be prevented in the second dielectric layer 222 and the third dielectric layer 251 of the first semiconductor chip 200. As a result, the semiconductor package 1000 may increase in bonding reliability.

In addition, the upper dummy pad TDP and the lower dummy pad BDP may be in at least partial contact with each other. There may be an increase in bonding strength between neighboring first semiconductor chips 200 on the edge region ER. Accordingly, the semiconductor package 1000 may increase in entire bonding reliability.

Because the main pads MP and the dummy pads DP may include the same material, the main region MR and the edge region ER may have similar metal densities to each other. Therefore, when a planarization process (e.g., CMP) is performed on the first semiconductor chip 200, a CMP removal rate on the main region MR may be substantially the same as that of the edge region ER. The creation of void may thus be prevented in the second dielectric layer 222 and the third dielectric layer 251 of the first semiconductor chip 200, and as a result the semiconductor package 1000 may increase in bonding reliability.

Referring again to FIG. 3, a first width W1 may be given as a width (e.g., maximum width) in the first direction X or the second direction Y of each of the upper main pad TMP and the lower main pad BMP. A second width W2 may be given as a width (e.g., maximum width) in the first direction X or the second direction Y of each of the upper dummy pad TDP and the lower dummy pad BDP. For example, the second width W2 may be substantially the same as the first width W1.

A first pitch or spacing L1 may be given as a pitch or spacing between neighboring ones of a plurality of upper main pads TMP and a pitch or spacing between neighboring ones of a plurality of lower main pads BMP. A second pitch or spacing L2 may be given as a pitch or spacing between neighboring ones of a plurality of upper dummy pads TDP and a pitch or spacing between neighboring ones of a plurality of lower dummy pads BDP. For example, the second pitch L2 may be substantially the same as the first pitch L1. Alternatively, the second pitch L2 may be less than the first pitch L1. For example, the second pitch L2 may be about 0.5 times to about 1 times the first pitch L1.

Figure 4:
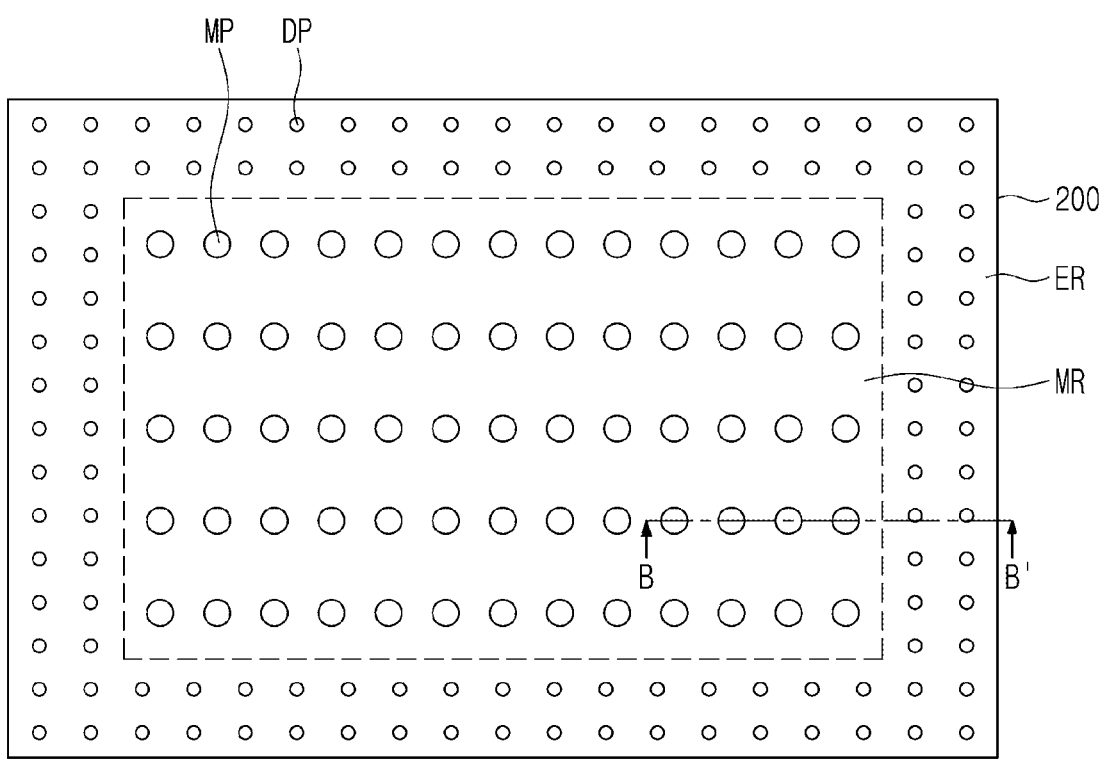
FIG. 4 illustrates a plan view showing a semiconductor package according to some embodiments of the present inventive concepts.
Figure 4:
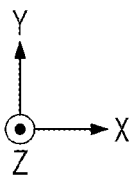
Figure 5:
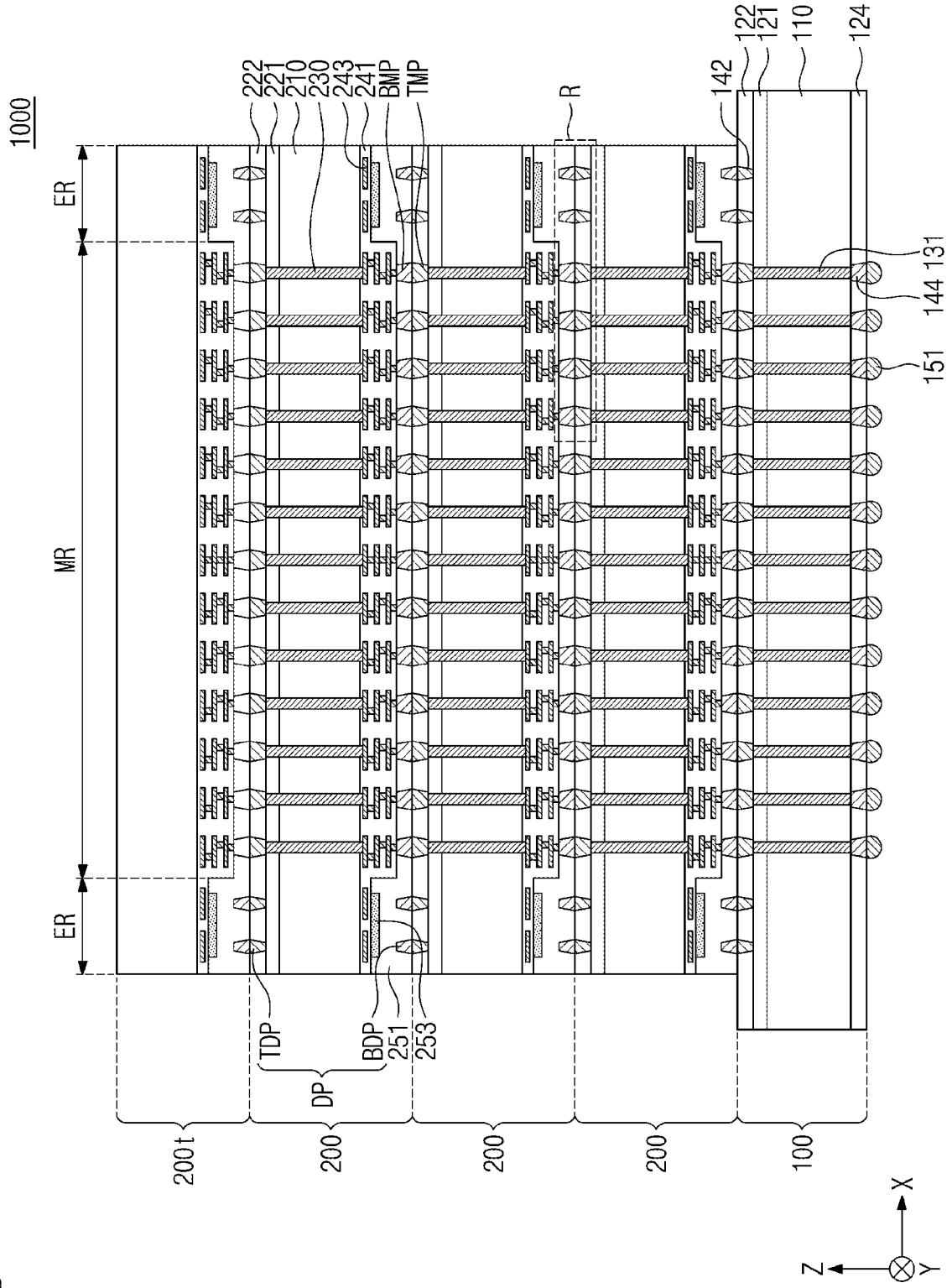
FIG. 5 illustrates a cross-sectional view showing a semiconductor package according to some embodiments of the present inventive concepts.
Figure 6:
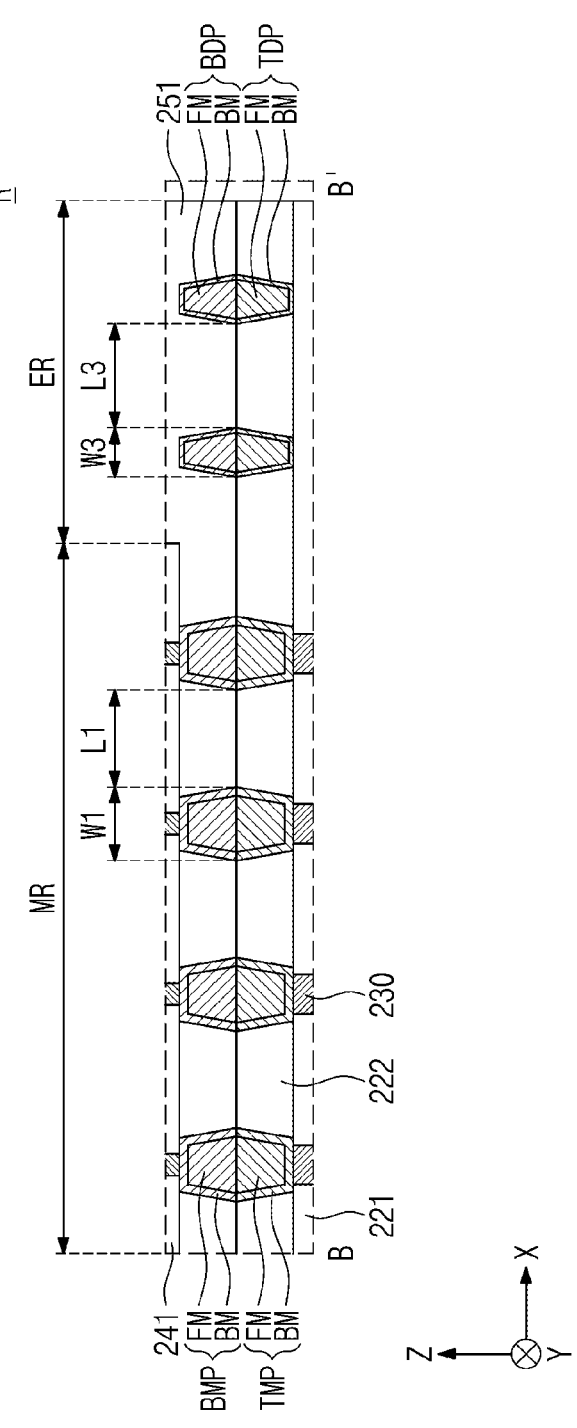
FIG. 6 illustrates an enlarged cross-sectional view showing section R of FIG. 5 taken along line B-B' of FIG. 4.

FIG. 4 illustrates a plan view showing a semiconductor device according to some embodiments of the present inventive concepts. FIG. 5 illustrates a cross-sectional view showing a semiconductor package according to some embodiments of the present inventive concepts. FIG. 6 illustrates an enlarged cross-sectional view showing section R of FIG. 5 taken along line B-B' of FIG. 4. Except that described below, in the interest of brevity, omissions may be made to avoid a repetitive description with reference to FIGS. 1 to 3.

Referring to FIGS. 4, 5, and 6, a third width W3 may be given as a width (e.g., maximum width) in the first direction X or the second direction Y of each of the upper dummy pad TDP and the lower dummy pad BDP in the semiconductor package 1000. The third width W3 may be less than the first width W1. For example, the third width W3 may be about 0.7 times to about 1 times the first width W1.

A third pitch or spacing L3 may be given as a pitch or spacing between neighboring ones of a plurality of upper dummy pads TDP and a pitch between neighboring ones of a plurality of lower dummy pads BDP. The third pitch L3 may be greater than the first pitch L1. For example, the third pitch L3 may be about 1 times to about 1.5 times the first length L1.

Figure 7:
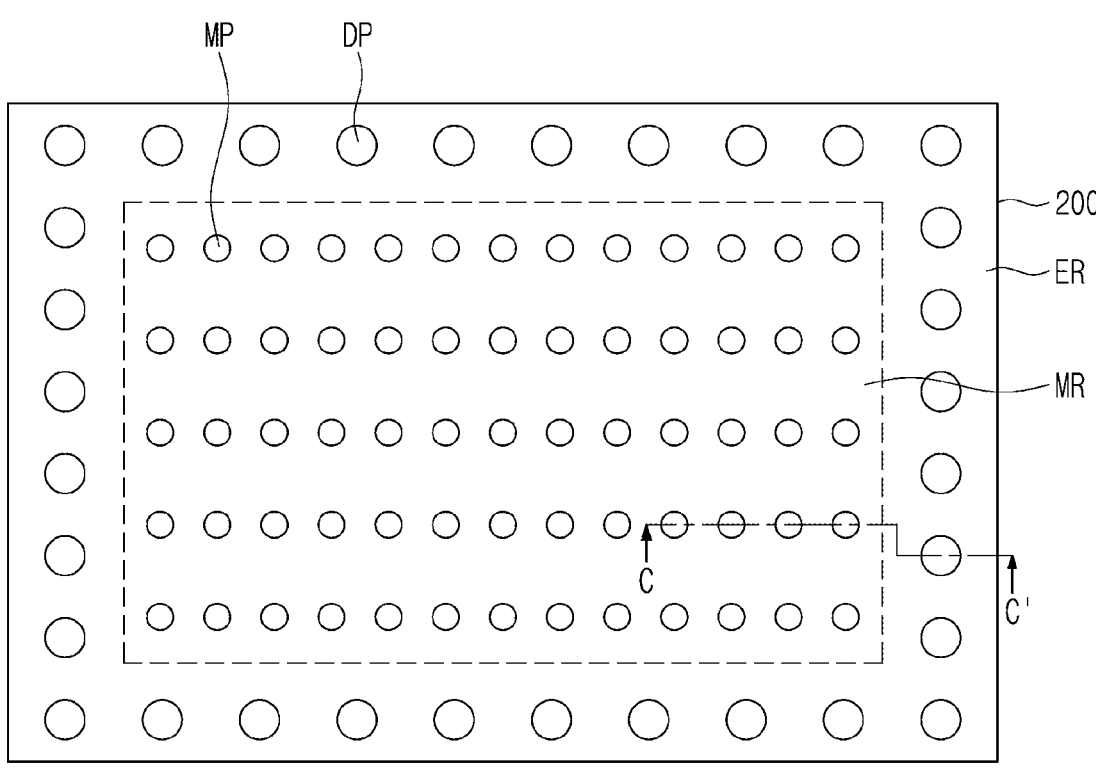
FIG. 7 illustrates a plan view showing a semiconductor package according to some embodiments of the present inventive concepts.
Figure 7:
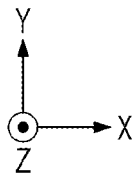
Figure 8:
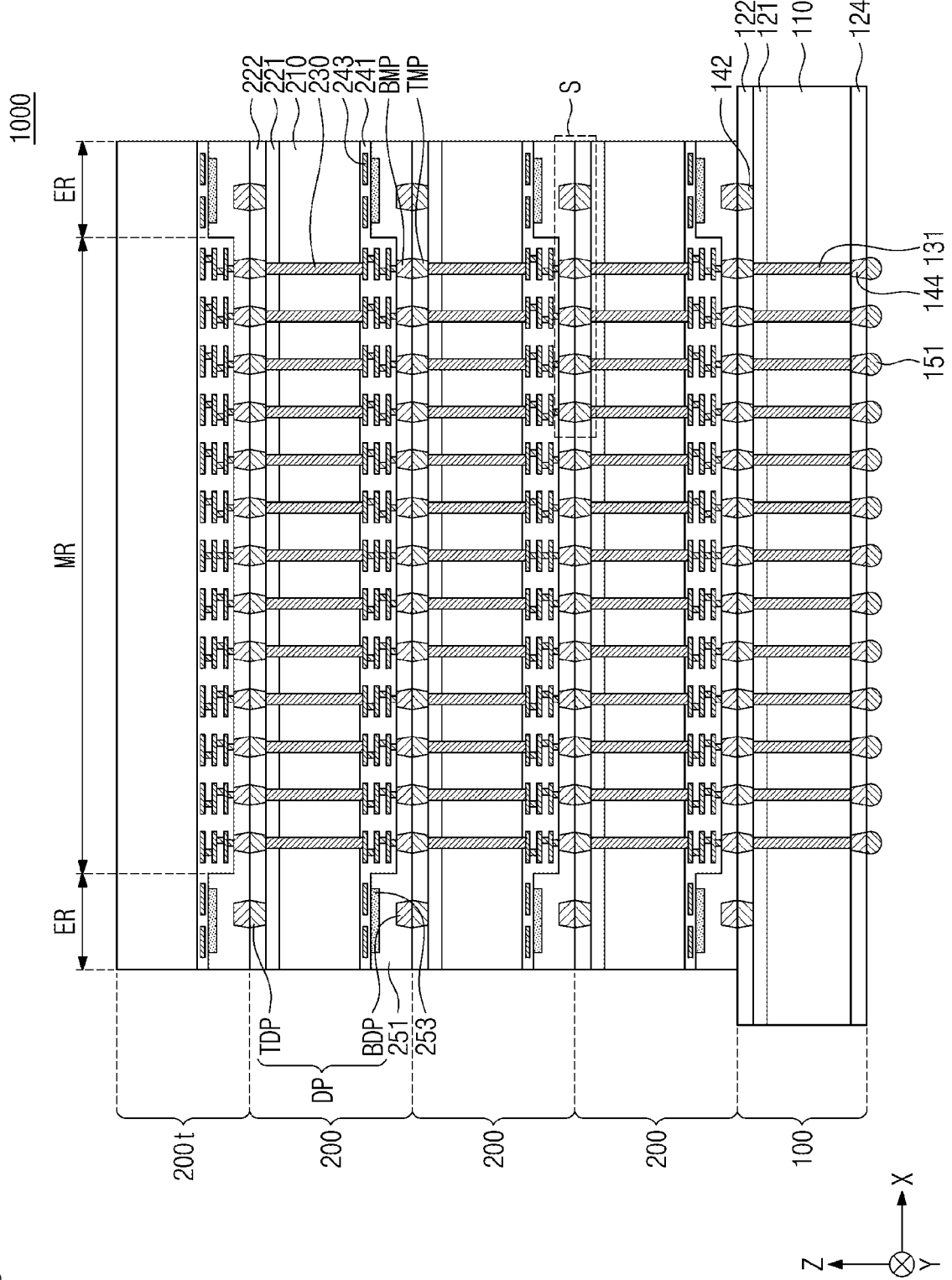
FIG. 8 illustrates a cross-sectional view showing a semiconductor package according to some embodiments of the present inventive concepts.
Figure 9:
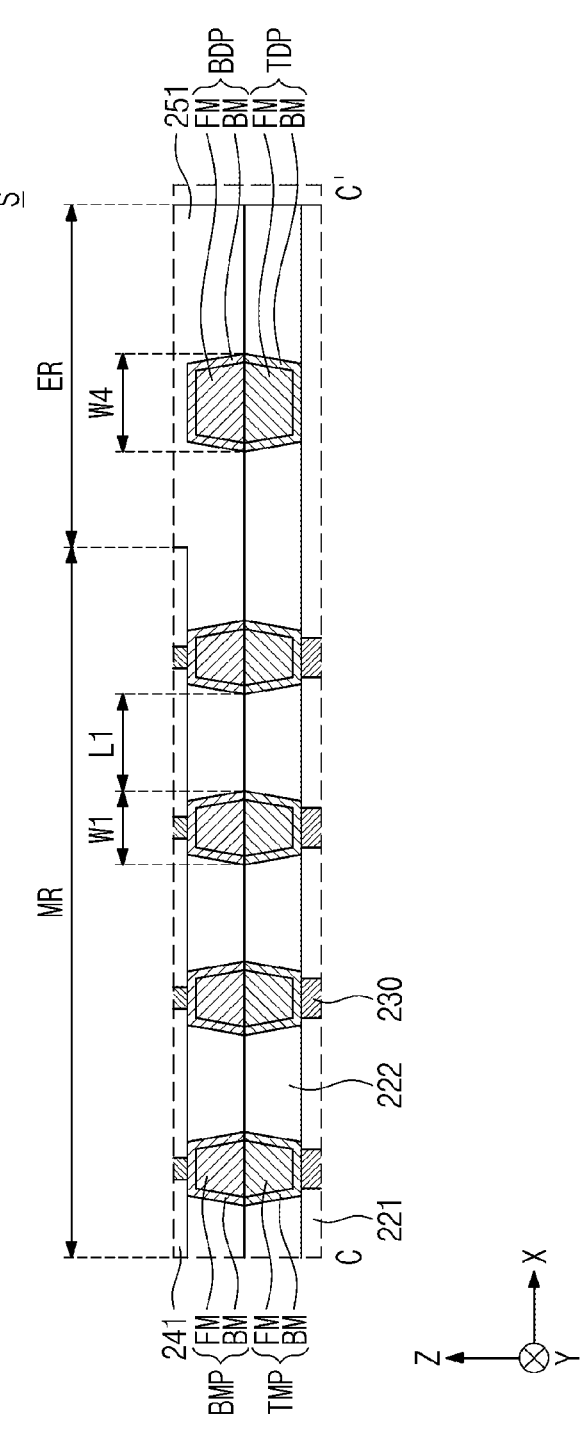
FIG. 9 illustrates an enlarged cross-sectional view showing section S of FIG. 8 taken along line C-C' of FIG. 7.

FIG. 7 illustrates a plan view showing a semiconductor package according to some embodiments of the present inventive concepts. FIG. 8 illustrates a cross-sectional view showing a semiconductor package according to some embodiments of the present inventive concepts. FIG. 9 illustrates an enlarged cross-sectional view showing section S of FIG. 8 taken along line C-C' of FIG. 7. Except that described below, in the interest of brevity, omissions may be made to avoid a repetitive description with reference to FIGS. 1 to 3.

Referring to FIGS. 7, 8, and 9, a fourth width W4 may be given as a width (e.g., maximum width) in the first direction X or the second direction Y of each of the upper dummy pad TDP and the lower dummy pad BDP in the semiconductor package 1000. The fourth width W4 may be greater than the first width W1. For example, the fourth width W4 may be about 1 times to about 1.3 times the first width W1.

In the semiconductor package 1000 according to the present inventive concepts, a width in the first direction X or the second direction Y of each dummy pad DP may have a certain range. In addition, a pitch or spacing between neighboring dummy pads DP may have a certain range. For example, a width in the first direction X or the second direction Y of each dummy pad DP may be about 0.7 times to about 1.3 times that in the first direction X or the second direction Y of each main pad MP. A pitch or spacing between neighboring dummy pads DP may be about 0.5 times to about 1.5 times that between neighboring main pads MP. When the pitch in the first direction X or the second direction Y of each dummy pad DP is deviated from the certain range, the main region MR and the edge region ER may have their CMP removal rates different from each other. To put it another way, as the width in the first direction X or the second direction Y of each dummy pad DP has its certain range, and as the pitch between neighboring dummy pads DP has its certain range, the main region MR and the edge region ER may have their CMP removal rates substantially the same as each other. The creation of void may thus be prevented in the second dielectric layer 222 and the third dielectric layer 251 of the first semiconductor chip 200, and as a result the semiconductor package 1000 may increase in bonding reliability.

Figure 10A:
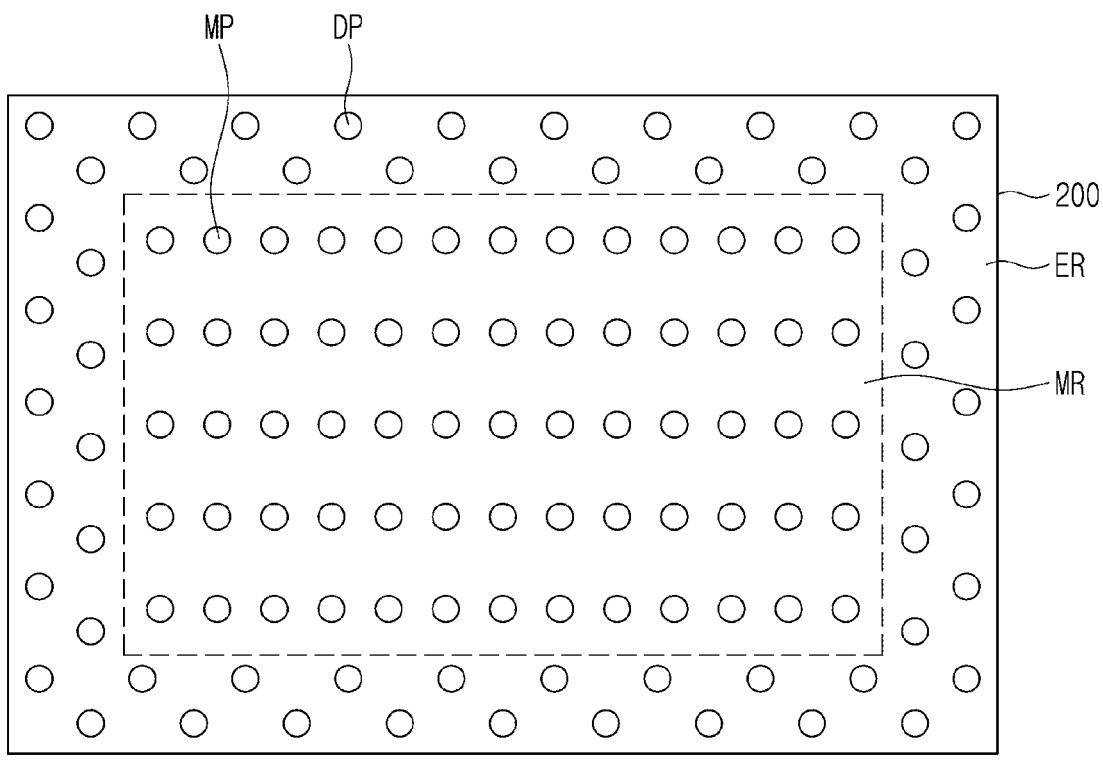
FIG. 10A illustrates a plan view showing a semiconductor package according to some embodiments of the present inventive concepts.
Figure 10A:
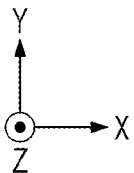
Figure 10B:
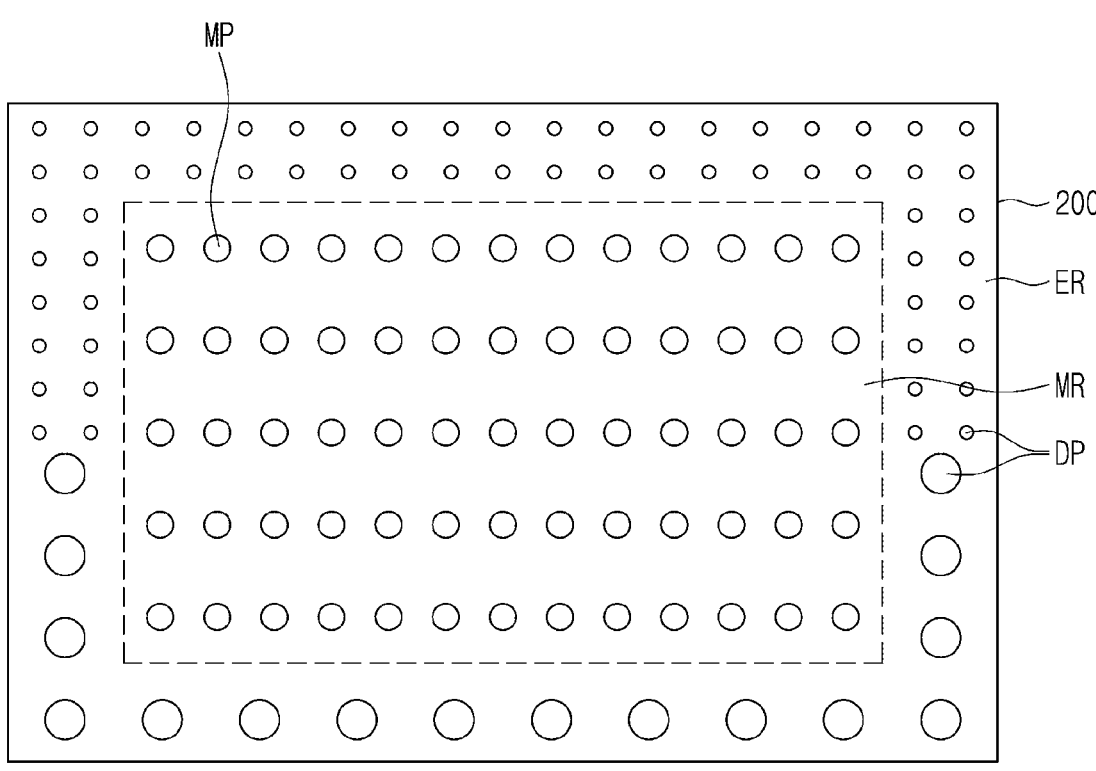
FIG. 10B illustrates a plan view showing a semiconductor package according to some embodiments of the present inventive concepts.
Figure 10B:
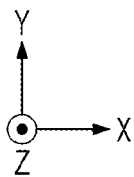

FIG. 10A illustrates a plan view showing a semiconductor package according to some embodiments of the present inventive concepts. FIG. 10B illustrates a plan view showing a semiconductor package according to some embodiments of the present inventive concepts. Except that described below, in the interest of brevity, omissions may be made to avoid a repetitive description with reference to FIGS. 1 to 3.

Referring to FIG. 10A, when viewed in plan, an arrangement of the dummy pads DP may be different from that of the main pads MP. For example, the dummy pads DP may be arranged in a zigzag or staggered fashion along the first direction X or the second direction Y.

Referring to FIG. 10B, the dummy pads DP may have different sizes from each other when viewed in plan. For example, the first semiconductor chip 200 may include the dummy pads DP whose planar sizes or widths are larger and simultaneously include the dummy pads DP whose planar sizes are smaller.

Figure 11A:
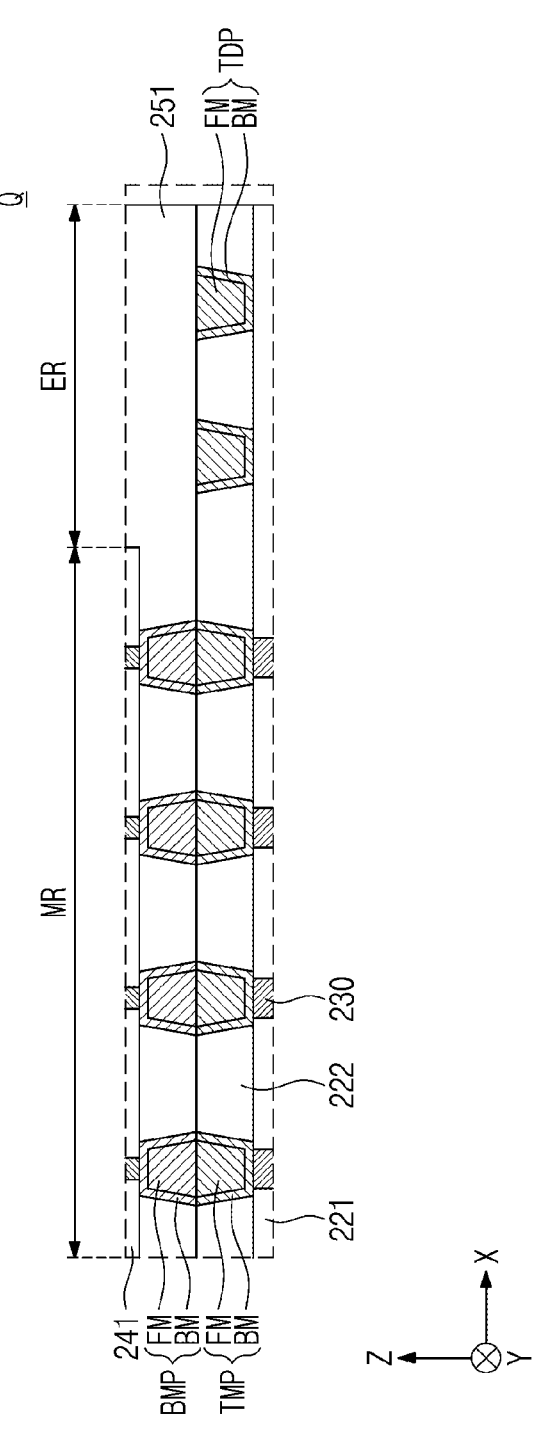
FIG. 11A illustrates an enlarged cross-sectional view of section Q depicted in FIG. 2, showing a semiconductor package according to some embodiments of the present inventive concepts.
Figure 11B:
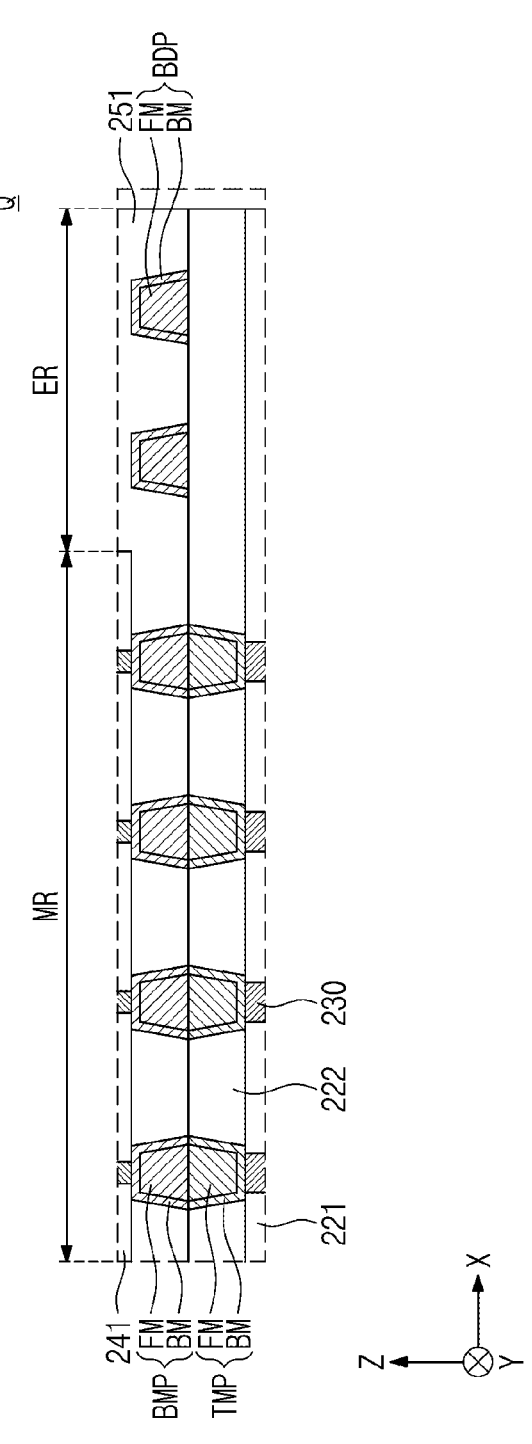
FIG. 11B illustrates an enlarged cross-sectional view of section Q depicted in FIG. 2, showing a semiconductor package according to some embodiments of the present inventive concepts.
Figure 11C:
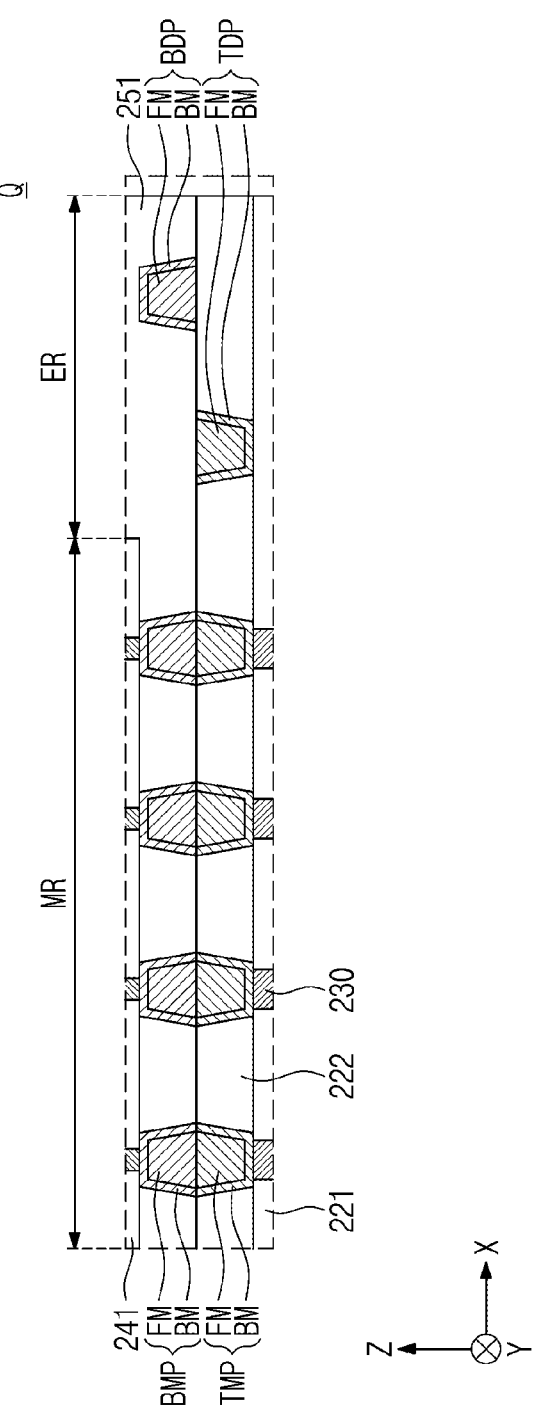
FIG. 11C illustrates an enlarged cross-sectional view of section Q of FIG. 2, showing a semiconductor package according to some embodiments of the present inventive concepts.
Figure 11D:
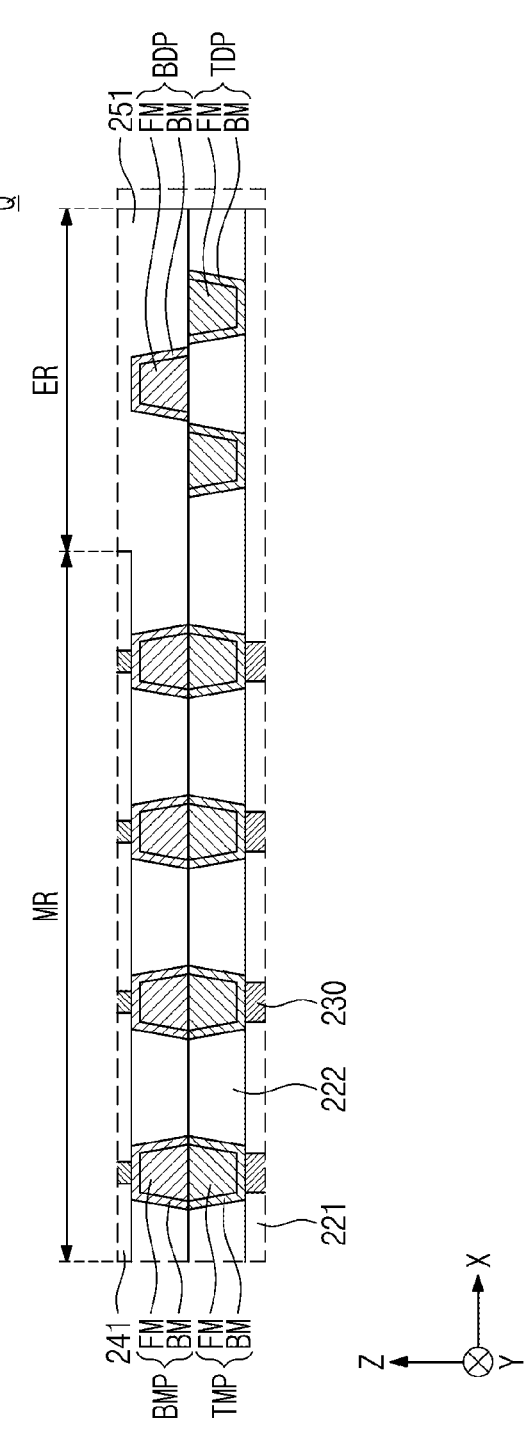
FIG. 11D illustrates an enlarged cross-sectional view of section Q depicted in FIG. 2, showing a semiconductor package according to some embodiments of the present inventive concepts.

FIG. 11A illustrates an enlarged cross-sectional view of section Q depicted in FIG. 2, showing a semiconductor package according to some embodiments of the present inventive concepts. FIG. 11B illustrates an enlarged cross-sectional view of section Q depicted in FIG. 2, showing a semiconductor package according to some embodiments of the present inventive concepts. FIG. 11C illustrates an enlarged cross-sectional view of section Q depicted in FIG. 2, showing a semiconductor package according to some embodiments of the present inventive concepts. FIG. 11D illustrates an enlarged cross-sectional view of section Q depicted in FIG. 2, showing a semiconductor package according to some embodiments of the present inventive concepts. Except that described below, in the interest of brevity, omissions may be made to avoid a repetitive description with reference to FIGS. 1 to 3.

Referring to FIGS. 11A to 11D, the upper dummy pad TDP and the lower dummy pad BDP may not be in contact with each other. As shown in FIG. 11A, the first semiconductor chip 200 may not include the lower dummy pad BDP. As illustrated in FIG. 11B, the first semiconductor chip 200 may not include the upper dummy pad TDP. As depicted in FIG. 11C, at least one may be omitted from the upper dummy pads TDP, and at least one may be omitted from the lower dummy pads BDP, with the result that the upper dummy pad TDP and the lower dummy pad BDP may not be in contact with each other. For example, the lower dummy pad BDP may be absent on the upper dummy pad TDP, and the upper dummy pad TDP may be absent below the lower dummy pad BDP. As also shown in FIG. 11D, the lower dummy pad BDP and the upper dummy pad TDP may alternately appear in the first direction X or the second direction Y, and the upper dummy pad TDP and the lower dummy pad BDP may not be in contact with each other.

Figure 11E:
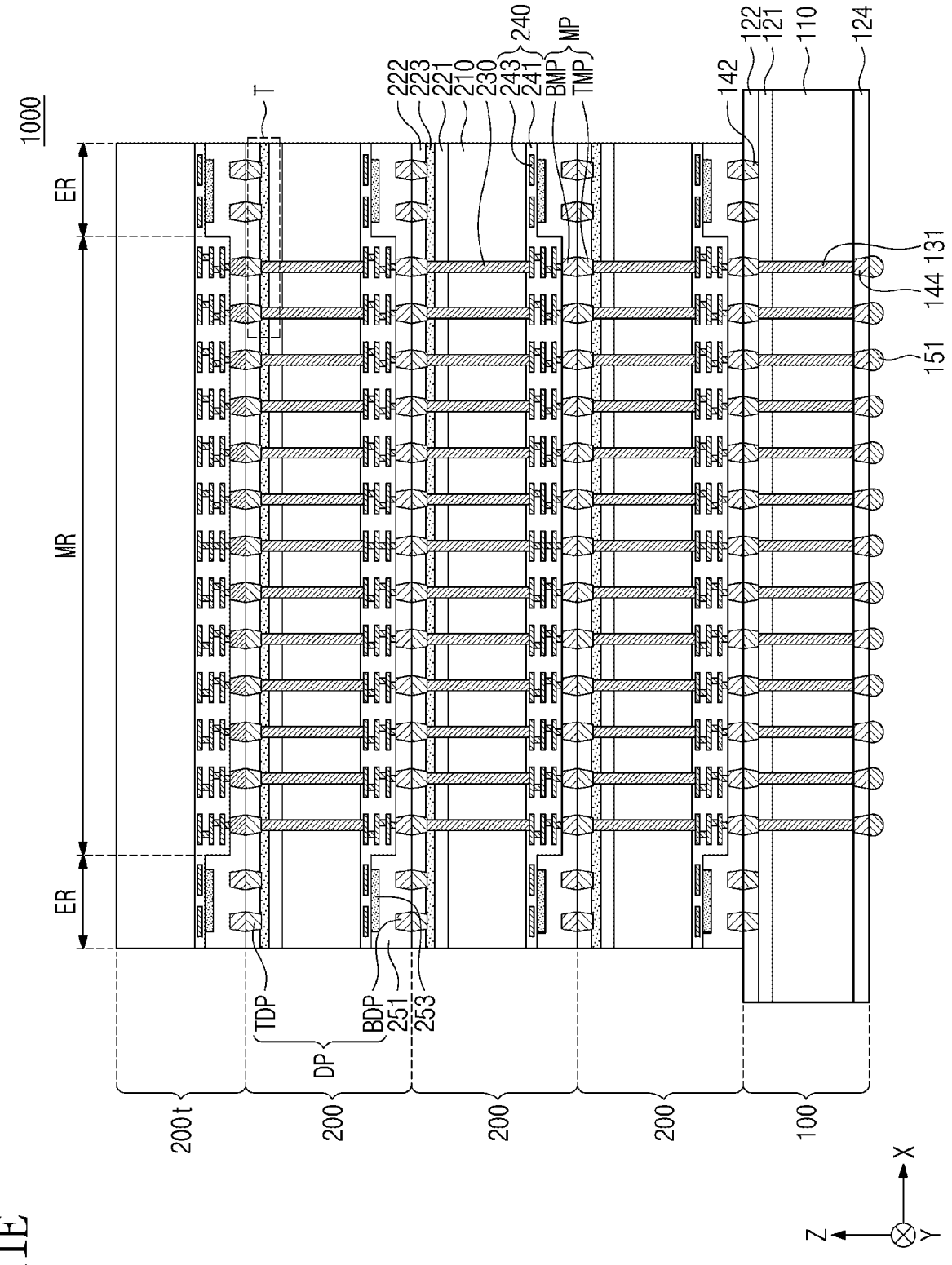
FIG. 11E illustrates a cross-sectional view showing a semiconductor package according to some embodiments of the present inventive concepts.
Figure 11F:
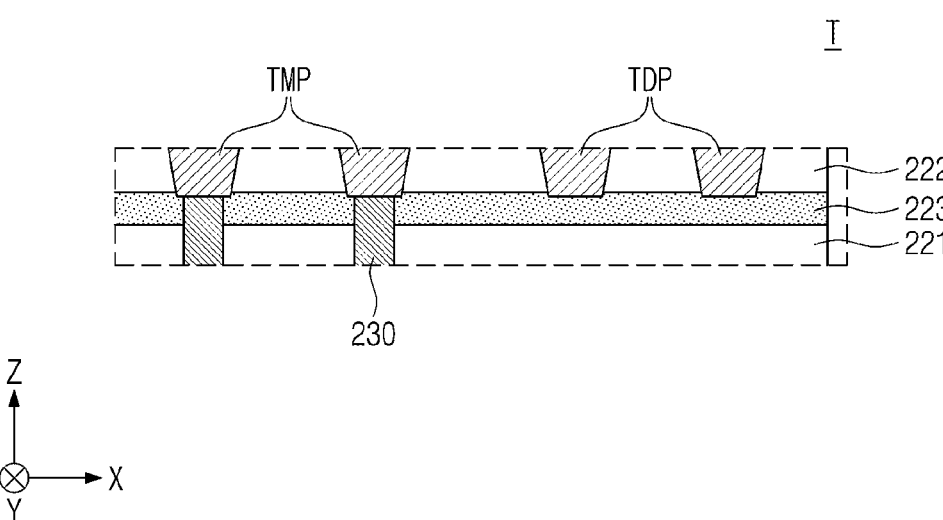
FIG. 11F illustrates an enlarged cross-sectional view of section T depicted in FIG. 11E, showing a semiconductor package according to some embodiments of the present inventive concepts.

FIG. 11E illustrates a cross-sectional view showing a semiconductor package according to some embodiments of the present inventive concepts. FIG. 11F illustrates an enlarged cross-sectional view of section T depicted in FIG. 11E, showing a semiconductor package according to some embodiments of the present inventive concepts. Except that described below, in the interest of brevity, omissions may be made to avoid a repetitive description with reference to FIGS. 1 to 3.

Referring to FIGS. 11E and 11F, the first semiconductor chip 200 of the semiconductor package 1000 may further include a fourth dielectric layer 223 between the first dielectric layer 221 and the second dielectric layer 222. The first dielectric layer 221 and the second dielectric layer 222 may have their thicknesses each of which is greater than that of the fourth dielectric layer 223. The upper main pad TMP and the upper dummy pad TDP may penetrate a portion of the fourth dielectric layer 223. The second through via 230 may penetrate a portion of the fourth dielectric layer 223 to be coupled to the upper main pad TMP. The upper main pad TMP and the upper dummy pad TDP may have their bottom surfaces located at a higher vertical level than that of a bottom surface of the fourth dielectric layer 223. The fourth dielectric layer 223 may include a dielectric material having an etch selectivity with respect to the first dielectric layer 221 and the second dielectric layer 222. For example, the fourth dielectric layer 223 may include one or more of silicon nitride, silicon oxynitride, and low-k dielectric materials. The fourth dielectric layer 223 may serve as an etch stop layer in forming the upper main pad TMP and the upper dummy pad TDP. The uppermost first semiconductor chip 200t of the first semiconductor chips 200 may not further include the fourth dielectric layer 223.

Figure 12:
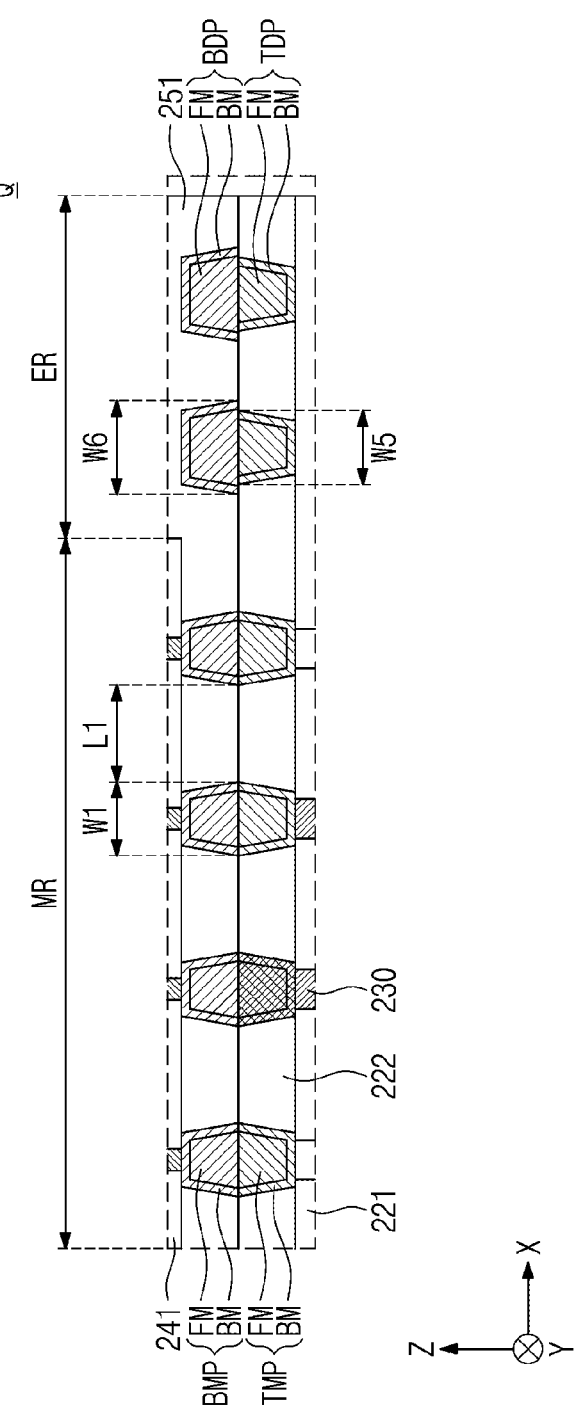
FIG. 12 illustrates an enlarged cross-sectional view of section Q of FIG. 2, showing a semiconductor package according to some embodiments of the present inventive concepts.

FIG. 12 illustrates an enlarged cross-sectional view of section Q depicted in FIG. 2, showing a semiconductor package according to some embodiments of the present inventive concepts. Except that described below, in the interest of brevity, omissions may be made to avoid a repetitive description with reference to FIGS. 1 to 3.

Referring to FIG. 12, a fifth width W5 may be given as a width (e.g., maximum width) in the first direction X or the second direction Y of the upper dummy pad TDP. A sixth width W6 may be given as a width (e.g., maximum width) in the first direction X or the second direction Y of the lower dummy pad BDP. The fifth width W5 and the sixth width W6 may be different from each other. For example, the fifth width W5 may be less than the sixth width W6. Although not shown, the fifth width W5 may be greater than the sixth width W6. In this case, the barrier pattern BM of the upper dummy pad TDP may not be in contact with the barrier pattern BM of the lower dummy pad BDP.

Figure 13:
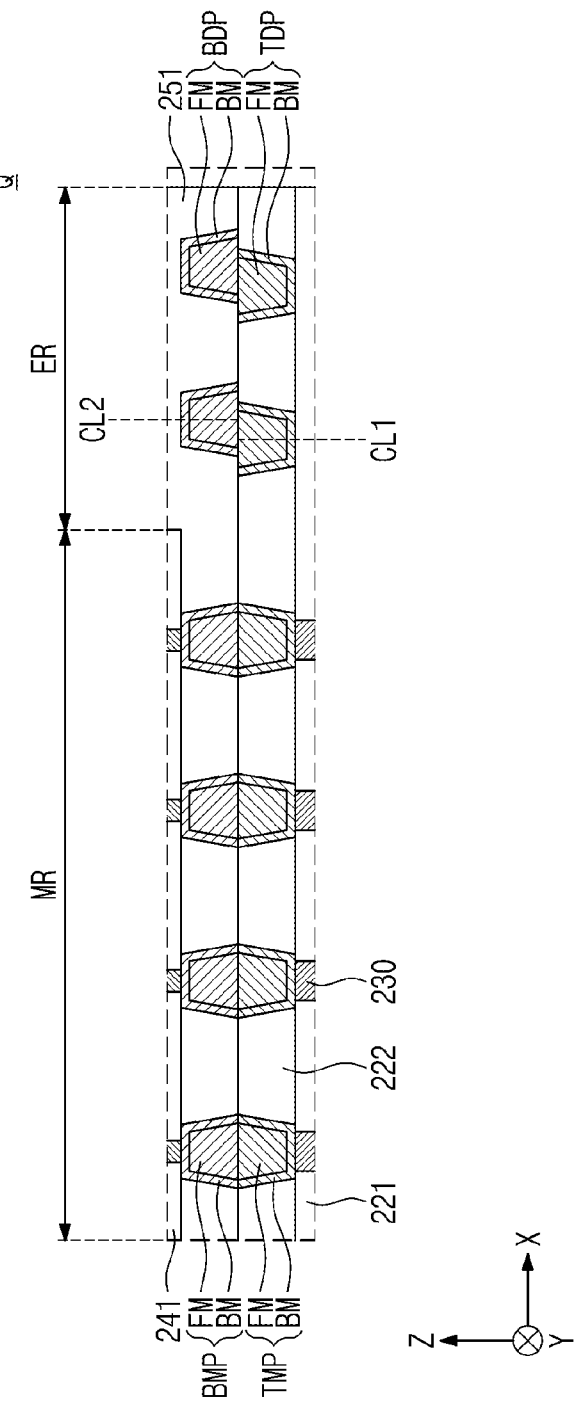
FIG. 13 illustrates an enlarged cross-sectional view of section Q depicted in FIG. 2, showing a semiconductor package according to some embodiments of the present inventive concepts.

FIG. 13 illustrates an enlarged cross-sectional view of section Q depicted in FIG. 2, showing a semiconductor package according to some embodiments of the present inventive concepts. Except that described below, in the interest of brevity, omissions may be made to avoid a repetitive description with reference to FIGS. 1 to 3.

Referring to FIG. 13, when viewed in vertical section, a first central line CL1 may be defined which passes through a center in the first direction X of the upper dummy pad TDP and is parallel to the third direction Z (e.g., first central vertical line CL1). When viewed in vertical section, a second central line CL2 may be defined which passes through a center in the first direction X of the lower dummy pad BDP and is parallel to the third direction Z (e.g., second central vertical line CL2). The first central line CL1 and the second central line CL2 may not overlap each other or may be horizontally offset from one another. For example, when viewed in plan, the upper dummy pad TDP and the lower dummy pad BDP may have their centers that do not coincide with each other.

FIGS. 14 to 18 illustrate cross-sectional views showing a method of fabricating a semiconductor package shown in FIG. 2 according to some embodiments of the present inventive concepts.

Figure 14:
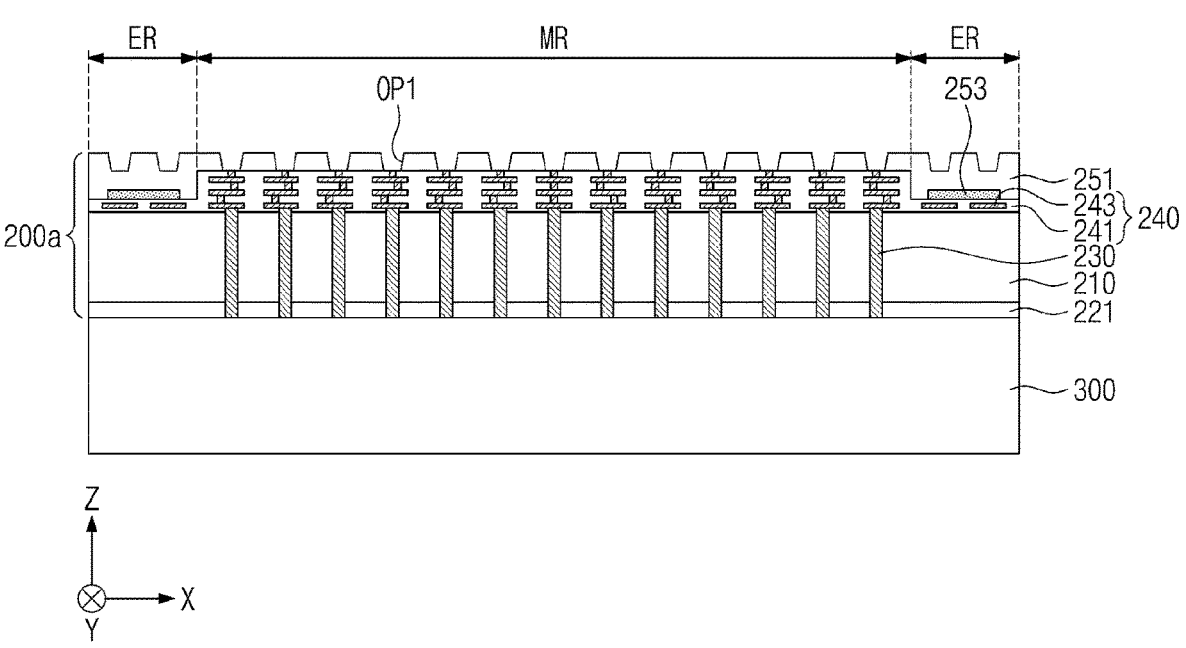
FIGS. 14 to 18 illustrate cross-sectional views showing a method of fabricating a semiconductor package shown in FIG. 2 according to some embodiments of the present inventive concepts.

Referring to FIG. 14, a first carrier substrate 300 may be mounted thereon with a preliminary semiconductor chip 200a that has experienced a front-end process and a back-end process. The preliminary semiconductor chip 200a may include a first semiconductor substrate 210, a first dielectric layer 221, a second through via 230, and a wiring layer 240. Referring together to FIGS. 1 and 14, when viewed in plan, the preliminary semiconductor chip 200a may include a main region MR disposed on a central area thereof and an edge region ER that surrounds the main region MR.

A third dielectric layer 251 may be formed on the wiring layer 240 of the preliminary semiconductor chip 200a. The formation of the third dielectric layer 251 may include forming a dielectric layer on the wiring layer 240 and performing on the dielectric layer a photolithography process and a dry etching process to form a first opening OP1. After the fabrication procedure in accordance with FIG. 14, the preliminary semiconductor chip 200a may further include the third dielectric layer 251.

Figure 15:
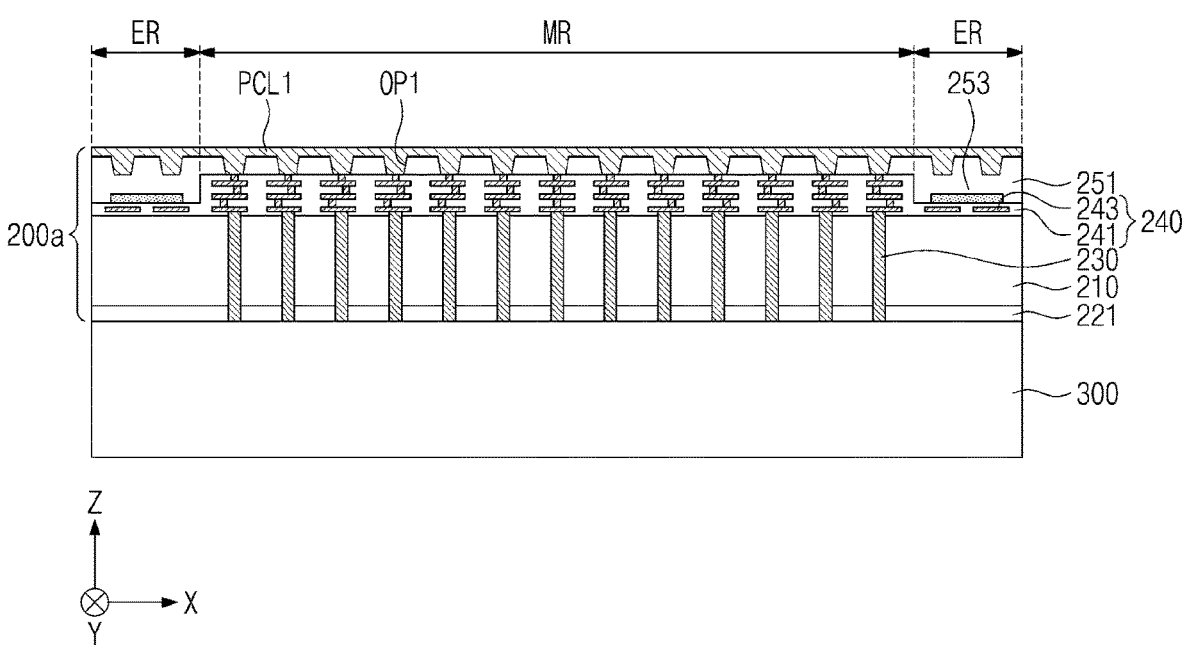

Referring to FIG. 15, a first preliminary conductive layer PCL1 may be formed on the third dielectric layer 251 of the preliminary semiconductor chip 200a. The first preliminary conductive layer PCL1 may fill the first opening OP1. The first preliminary conductive layer PCL1 may be formed on both of the main region MR and the edge region ER. Although not shown, the first preliminary conductive layer PCL1 may include a first preliminary barrier pattern layer and a first preliminary conductive pattern layer on the first preliminary barrier pattern layer. The first preliminary conductive layer PCL1 may be formed by an electroplating process. The first preliminary conductive layer PCL1 may include the same material as that of the main and dummy pads MP and DP of FIG. 3. For example, the first preliminary barrier pattern layer may include the same material as that of the barrier pattern BM, and the first preliminary conductive pattern layer may include the same material as that of the conductive pattern FM.

Figure 16:
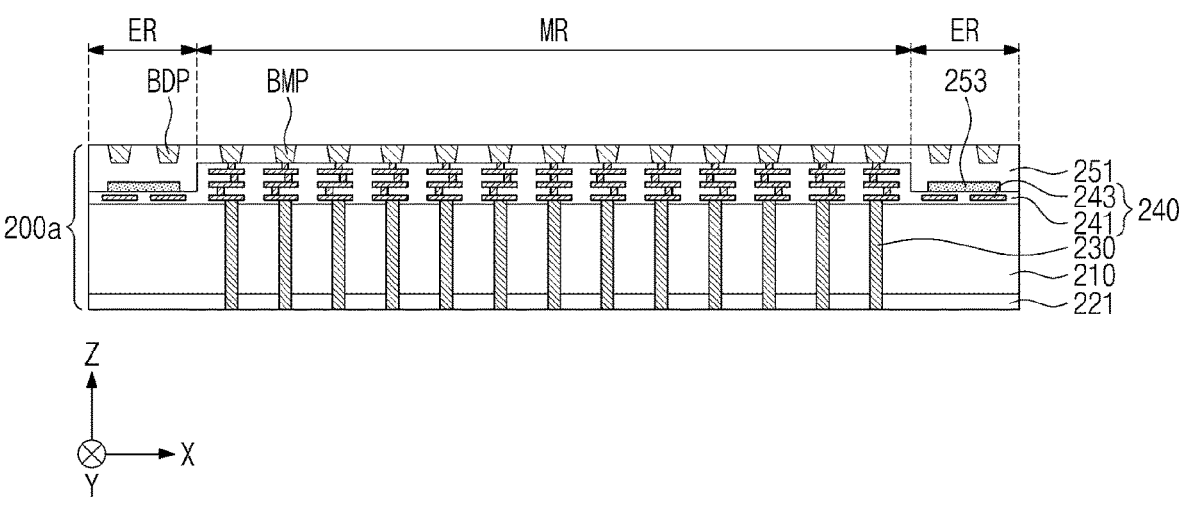

Referring to FIG. 16, the first preliminary conductive layer PCL1 may undergo a planarization process to form a lower main pad BMP and a lower dummy pad BDP. The planarization process may continue to reach an uppermost surface of the third dielectric layer 251. A portion of the third dielectric layer 251 may be removed during the planarization process. The planarization process may include, for example, chemical mechanical planarization (CMP). After the planarization process is performed, the first carrier substrate 300 may be removed. After the fabrication procedure in accordance with FIG. 16, the preliminary semiconductor chip 200a may further include the lower main pad BMP and the lower dummy pad BDP.

Figure 17:
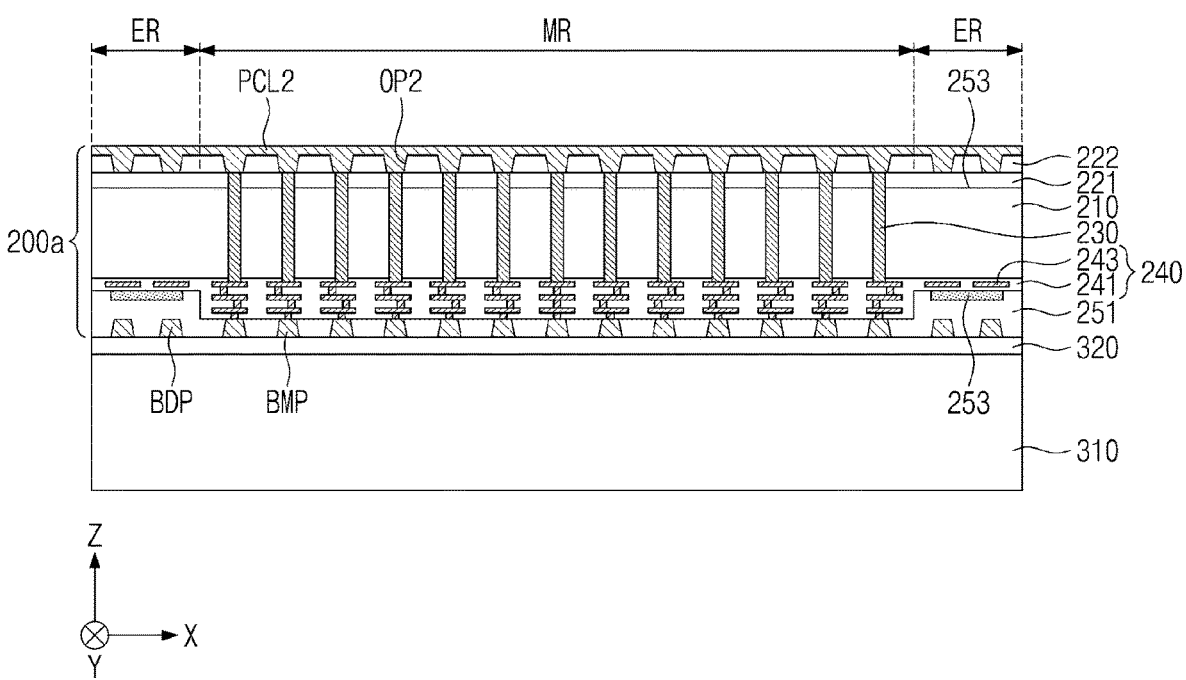

Referring to FIG. 17, the preliminary semiconductor chip 200a of FIG. 16 may be flipped by about 180 degrees, such that the preliminary semiconductor chip 200a may be mounted on a second carrier substrate 310. An adhesive 320 may be interposed between the preliminary semiconductor chip 200a and the second carrier substrate 310. The adhesive 320 may serve to fix the preliminary semiconductor chip 200a to the second carrier substrate 310.

A second dielectric layer 222 may be formed on the first dielectric layer 221 of the preliminary semiconductor chip 200a. The formation of the second dielectric layer 222 may include forming a dielectric layer on the first dielectric layer 221 and performing on the dielectric layer a photolithography process and a dry etching process to form a second opening OP2. After the fabrication procedure in accordance with FIG. 17, the preliminary semiconductor chip 200a may further include the second dielectric layer 222.

A second preliminary conductive layer PCL2 may be formed on the second dielectric layer 222 of the preliminary semiconductor chip 200a. The second preliminary conductive layer PCL2 may fill the second opening OP2. The second preliminary conductive layer PCL2 may be formed on both of the main region MR and the edge region ER. Although not shown, the second preliminary conductive layer PCL2 may include a second preliminary barrier pattern layer and a second preliminary conductive pattern layer on the second preliminary barrier pattern layer. The second preliminary conductive layer PCL2 may be formed by an electroplating process. The second preliminary conductive layer PCL2 may include the same material as that of the main and dummy pads MP and DP of FIG. 3. For example, the second preliminary barrier pattern layer may include the same material as that of the barrier pattern BM, and the second preliminary conductive pattern layer may include the same material as that of the conductive pattern FM.

Figure 18:
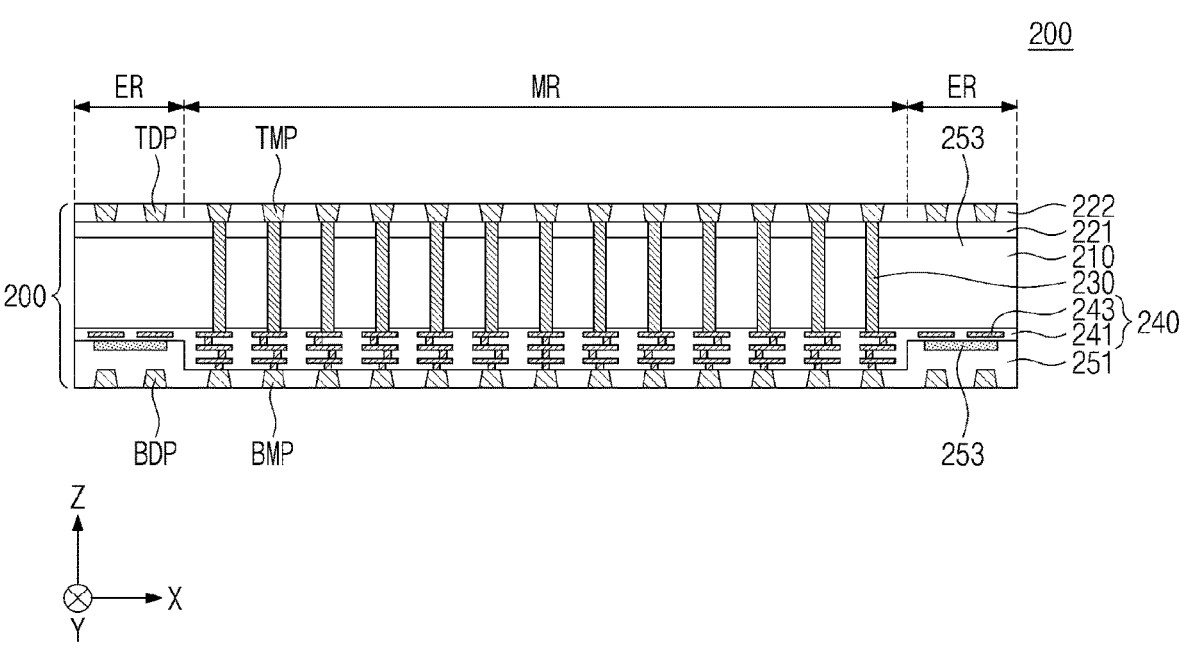

Referring to FIG. 18, the second preliminary conductive layer PCL2 may undergo a planarization process to form an upper main pad TMP and an upper dummy pad TDP. The planarization process may continue to reach an uppermost surface of the second dielectric layer 222. A portion of the second dielectric layer 222 may be removed during the planarization process. The planarization process may include, for example, chemical mechanical planarization (CMP). After the planarization process is performed, the second carrier substrate 310 and the adhesive 320 may be removed. Therefore, a first semiconductor chip 200 may be formed.

Referring back to FIG. 2, the first semiconductor chips 200 may be stacked on a buffer chip 100. A semiconductor package 1000 may thus be fabricated.

Figure 19:
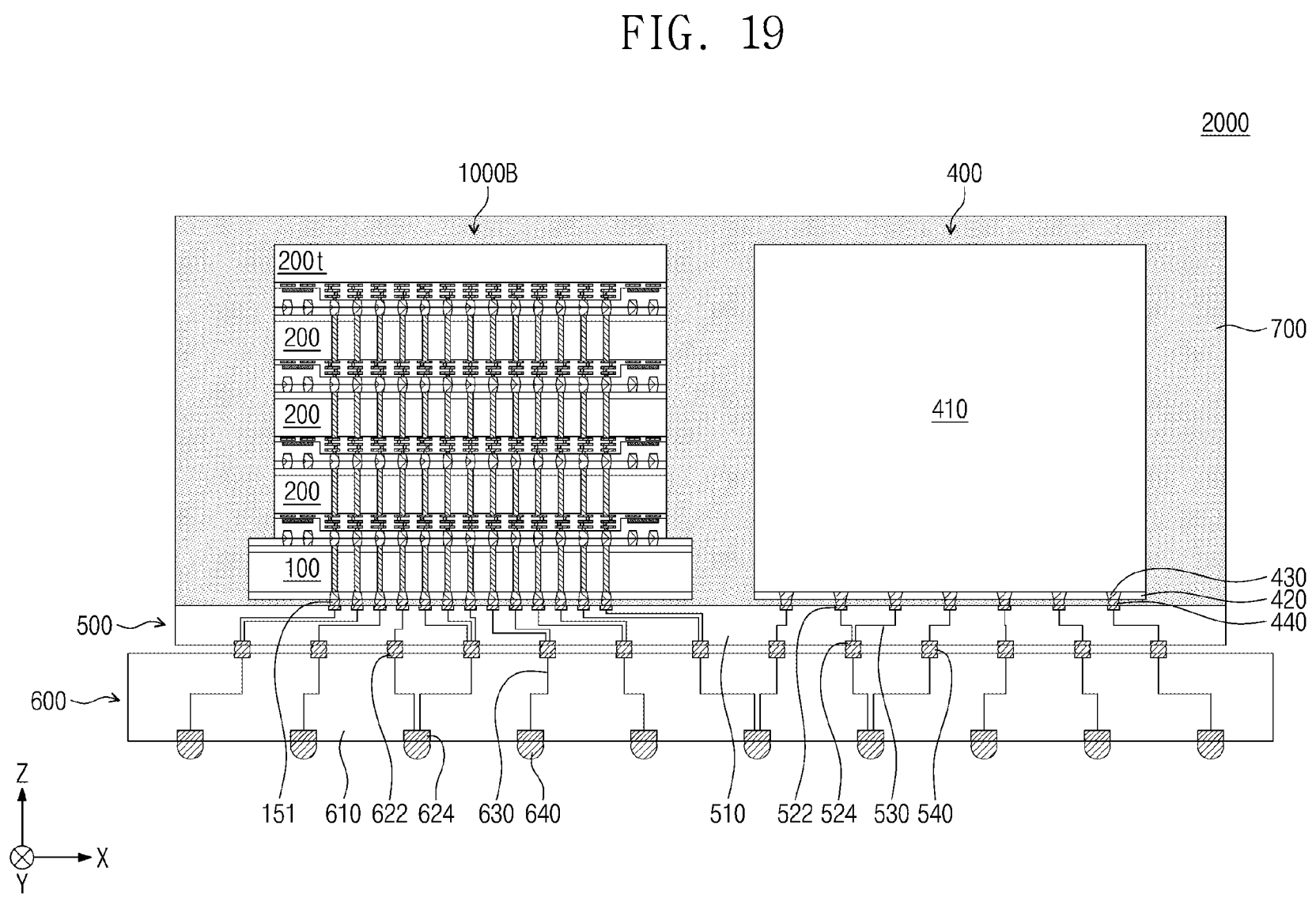

FIG. 19 illustrates a cross-sectional view showing a semiconductor package according to some embodiments of the present inventive concepts.

Referring to FIG. 19, a semiconductor package 2000 may include a main board 600, an interposer 500, a sub-semiconductor package 1000B, a second semiconductor chip 400, and a molding layer 700. The main board 600 may be a printed circuit board (PCB). For example, the main board 600 may be a multi-layer printed circuit board.

The main board 600 may include a main substrate 610, a second upper pad 622, a second lower pad 624, second wiring patterns 630, and a first connection terminal 640. The main substrate 610 may include at least one selected from phenol resin, epoxy resin, and polyimide.

The second upper pad 622 may be provided on a top surface of the main substrate 610. The second lower pad 624 may be provided on a bottom surface of the main substrate 610. Although not shown, the main substrate 610 may be provided on the top surface with a solder resist layer that exposes the second upper pad 622, and may also be provided on the bottom surface with a solder resist layer that exposes the second lower pad 624. The second upper pad 622 and the second lower pad 624 may include a metallic material. The second upper pad 622 and the second lower pad 624 may include, for example, Cu, Al, Co, Ru, or any alloy thereof.

The second wiring patterns 630 may be provided in the main substrate 610. The second wiring patterns 630 may electrically connect the second upper pad 622 and the second lower pad 624 through the main substrate 610. The second wiring patterns 630 may include, for example, one of Cu, W, Ni, Co, and any alloy thereof.

The first connection terminal 640 may be included below the second lower pad 624. The first connection terminal 640 may include at least one selected from solder, pillars, and bumps. The first connection terminal 640 may include a conductive metallic material. The first connection terminal 640 may include at least one selected from, for example, tin (Sn), lead (Pb), nickel (Ni), gold (Au), silver (Ag), copper (Cu), and bismuth (Bi).

The interposer 500 may be provided on the main board 600. The interposer 500 may include an interposer substrate 510, a third upper pad 522, a third lower pad 524, third wiring patterns 530, and a second connection terminal 540.

The interposer substrate 510 may include a semiconductor, glass, ceramic, or plastic. For example, the interposer substrate 510 may include silicon.

The third upper pad 522 may be provided on a top surface of the interposer substrate 510. The third lower pad 524 may be provided on a bottom surface of the interposer substrate 510. The third upper pad 522 and the third lower pad 524 may include a metallic material. The third upper pad 522 and the third lower pad 524 may include, for example, Cu, Al, Co, Ru, or any alloy thereof.

The third wiring patterns 530 may electrically connect the third upper pad 522 and the third lower pad 524 through the interposer substrate 510. The third wiring patterns 530 may include, for example, one of Cu, W, Ni, Co, and any alloy thereof.

The second connection terminal 540 may be included below the third lower pad 524. The second connection terminal 540 may be interposed between the second upper pad 622 and the third lower pad 524. The second connection terminal 540 may be in contact with the second upper pad 622 and the third lower pad 524. Therefore, the interposer 500 and the main board 600 may be electrically connected to each other. The second connection terminal 540 may include at least one selected from solder, pillars, and bumps. The second connection terminal 540 may include a conductive metallic material. The second connection terminal 540 may include at least one selected from, for example, tin (Sn), lead (Pb), nickel (Ni), gold (Au), silver (Ag), copper (Cu), and bismuth (Bi).

The sub-semiconductor package 1000B may be provided on the interposer 500. The sub-semiconductor package 1000B may be the semiconductor package 1000 discussed in FIG. 2, 5, or 8.

An external connection terminal 151 of the sub-semiconductor package 1000B may be connected to the third upper pad 522 of the interposer 500. Therefore, the sub-semiconductor package 1000B and the interposer 500 may be electrically connected to each other.

The second semiconductor chip 400 may be provided on the interposer 500 and adjacent a lateral or side surface of the sub-semiconductor package 1000B. The second semiconductor chip 400 may include a second semiconductor substrate 410, a fifth dielectric layer 420, a chip pad 430, and a third connection terminal 440. The second semiconductor chip 400 may be a logic chip. For example, the second semiconductor chip 400 may be a central processing unit (CPU) chip, a graphic processing unit (GPU) chip, or an application processor (AP) chip.

The second semiconductor substrate 410 may be a silicon substrate, a silicon-germanium substrate, a germanium substrate, or a monocrystalline epitaxial layer grown on a monocrystalline silicon substrate. Additionally or alternatively, the second semiconductor substrate 410 may include a compound semiconductor, such as silicon carbide (SiC), gallium arsenide (GaAs), indium arsenide (InAs), or indium phosphide (InP).

The fifth dielectric layer 420 may be provided on a bottom surface of the second semiconductor substrate 410. The fifth dielectric layer 420 may include a dielectric material.

The chip pad 430 may be provided on a bottom surface of the second semiconductor substrate 410. The fifth dielectric layer 420 may cover or surround a lateral or side surface of the chip pad 430. A bottom surface of the fifth dielectric layer 420 may be coplanar with that of the chip pad 430.

The third connection terminal 440 may be provided below the chip pad 430. The third connection terminal 440 may be connected to the chip pad 430. The third connection terminal 440 may be connected to the third upper pad 522 of the interposer 500. Therefore, the second semiconductor chip 400 and the interposer 500 may be electrically connected to each other. The third connection terminal 440 may include at least one selected from solder, pillars, and bumps. The third connection terminal 440 may include a conductive metallic material. The third connection terminal 440 may include at least one selected from, for example, tin (Sn), lead (Pb), nickel (Ni), gold (Au), silver (Ag), copper (Cu), and bismuth (Bi).

The molding layer 700 may be provided to cover at least portions of the interposer 500, the sub-semiconductor package 1000B, and the second semiconductor chip 400. The molding layer 700 may include, for example, an epoxy molding compound (EMC). In some embodiments, the molding layer 700 may cover top surfaces of the sub-semiconductor package 1000B and the second semiconductor chip 400. In some embodiments, the molding layer 700 may not cover any of top surfaces of the sub-semiconductor package 1000B and the second semiconductor chip 400.

In a semiconductor package according to the present inventive concepts, each of semiconductor chips sequentially stacked may include dummy pads on an edge region. As the dummy pads cause main and edge regions to have their metal densities similar to each other, when a planarization process (e.g., CMP) is performed on the semiconductor chip to form main pads, a CMP removal rate on the main region may be substantially the same as that on the edge region. Accordingly, voids or non-bonding may be prevented in dielectric layers interposed between the semiconductor chips vertically adjacent to each other, and as a result the semiconductor package may increase in bonding reliability.

Although the present inventive concepts have been described in connection with some embodiments of the present inventive concepts illustrated in the accompanying drawings, it will be understood to those skilled in the art that various substitution, modifications, and changes may be thereto without departing from the scope of the present inventive concepts.

What is claimed is:

1. A semiconductor package, comprising:
a first semiconductor chip including a first main region and a first edge region that surrounds the first main region, the first main region being on a central area of the first semiconductor chip; and
a second semiconductor chip on the first semiconductor chip, the second semiconductor chip including a second main region and a second edge region that surrounds the second main region, the second main region being on a central area of the second semiconductor chip,
wherein the first semiconductor chip includes:
a first main pad on a top surface of the first semiconductor chip on the first main region; and
a first dummy pad on the top surface of the first semiconductor chip on the first edge region,
wherein the second semiconductor chip includes:
a first semiconductor substrate;
a wiring layer below the first semiconductor substrate, the wiring layer including a wiring dielectric layer and wiring patterns;
a second main pad below the wiring layer on the second main region; and
a second dummy pad below the wiring layer on the second edge region,
wherein a first portion of the wiring layer is on the second main region and has a first thickness, and the wiring layer has a second portion on the second edge region having a second thickness that is greater than the first thickness.

2. The semiconductor package of claim 1, wherein
a first distance is a minimum vertical distance from the second main pad to the wiring patterns on the second main region,
a second distance is a minimum vertical distance from the second dummy pad to the wiring patterns on the second edge region, and
the second distance is greater than the first distance.

3. The semiconductor package of claim 1, wherein the first and second main pads and the first and second dummy pads include the same metallic material.

4. The semiconductor package of claim 1, wherein
a first width is a maximum width in a first direction of the first main pad, the first direction being parallel to the top surface of the first semiconductor chip,
a second width is a maximum width in the first direction of the second main pad, and
the first width and the second width are substantially the same.

5. The semiconductor package of claim 4, wherein
a third width is a maximum width in the first direction of the first dummy pad,
a fourth width is a maximum width in the first direction of the second dummy pad,
the third width and the fourth width are substantially the same, and each of the third width and the fourth width is about 0.7 times to about 1.3 times the first width.

6. The semiconductor package of claim 1, wherein a maximum width in a first direction of the first dummy pad is different from a maximum width in the first direction of the second dummy pad, the first direction being parallel to the top surface of the first semiconductor chip.

7. The semiconductor package of claim 1, wherein
a first central line is a central vertical line that passes through a center of the first dummy pad,
a second central line is a central vertical line that passes through a center of the second dummy pad, and
the first central line and the second central line are horizontally offset.

8. The semiconductor package of claim 1, wherein
the first semiconductor chip further includes a first through via that penetrates at least a portion of the first semiconductor chip and is connected to the first main pad, and
the second semiconductor chip further includes a second through via that penetrates at least a portion of the second semiconductor chip and is connected to the second main pad.

9. The semiconductor package of claim 1, wherein
the first dummy pad includes a first conductive pattern and a first barrier pattern that surrounds at least a portion of the first conductive pattern,
the second dummy pad includes a second conductive pattern and a second barrier pattern that surrounds at least a portion of the second conductive pattern,
the first barrier pattern exposes a top surface of the first conductive pattern,
the second barrier pattern exposes a bottom surface of the second conductive pattern, and
the first conductive pattern and the second conductive pattern are in contact with each other.

10. The semiconductor package of claim 1, wherein the first semiconductor chip further includes:
a second semiconductor substrate; and
a first dielectric layer and a second dielectric layer that are sequentially stacked on the second semiconductor substrate,
wherein the first dummy pad is on the first dielectric layer, and
wherein the second dielectric layer surrounds a side surface of the first dummy pad.

11. The semiconductor package of claim 1, wherein
the first dummy pad comprises a plurality of first dummy pads,
the second dummy pad comprises a plurality of second dummy pads,
the plurality of first dummy pads are arranged in a zigzag fashion in one of a first direction and a second direction that are parallel to the top surface of the first semiconductor chip, the second direction perpendicular to the first direction, and
the plurality of second dummy pads are arranged in a zigzag fashion in one of the first direction and the second direction.

12. The semiconductor package of claim 1, further comprising, on the first edge region, a third dummy pad on the top surface of the first semiconductor chip and adjacent the first dummy pad,
wherein a width in a first direction of the third dummy pad is different from a width in the first direction of the first dummy pad, the first direction being parallel to the top surface of the first semiconductor chip.

13. A semiconductor package, comprising a first semiconductor chip including a first main region and a first edge region that surrounds the first main region,
wherein the first semiconductor chip includes:
a semiconductor substrate;
a wiring layer below the semiconductor substrate, the wiring layer including a wiring dielectric layer and wiring patterns;
lower main pads on the first main region and below the wiring layer;
lower dummy pads on the first edge region and below the wiring layer; and
an edge pattern on the first edge region and between the wiring layer and the lower dummy pads,
wherein a lowermost surface of the wiring layer is at a vertical level lower than a vertical level of a bottom surface of the edge pattern,
wherein the edge pattern is vertically spaced apart from the lower dummy pads,
wherein a first spacing is a distance between neighboring ones of the lower main pads,
wherein a second spacing is a distance between neighboring ones of the lower dummy pads, and
wherein the second spacing is about 0.5 times to about 1.5 times the first spacing.

14. The semiconductor package of claim 13, further comprising a second semiconductor chip below the first semiconductor chip, the second semiconductor chip including a second main region and a second edge region that surrounds the second main region,
wherein the second semiconductor chip includes:
upper main pads on a top surface of the second semiconductor chip on the second main region; and
upper dummy pads on the top surface of the second semiconductor chip on the second edge region,
wherein the upper main pads are in contact with the lower main pads.

15. The semiconductor package of claim 14, wherein the upper dummy pads are in contact with the lower dummy pads.

16. The semiconductor package of claim 14, wherein
the first semiconductor chip further includes a first dielectric layer that surrounds a side surface of each of the lower dummy pads,
the second semiconductor chip further includes a second dielectric layer that surrounds a side surface of each of the upper dummy pads,
each of the upper dummy pads is in contact with the first dielectric layer, and
each of the lower dummy pads is in contact with the second dielectric layer.

17. The semiconductor package of claim 13, wherein the first semiconductor chip further includes:
upper main pads on a top surface of the first semiconductor chip on the first main region; and
upper dummy pads on the top surface of the first semiconductor chip on the first edge region,
through vias that penetrate at least a portion of the first semiconductor chip and connect the upper main pads to the lower main pads.

18. The semiconductor package of claim 17, wherein
the upper main pads and the lower main pads are electrically connected to the wiring patterns, and
the upper dummy pads and the lower dummy pads are electrically isolated from the wiring patterns.

19. A semiconductor package, comprising:
a main board;

an interposer on the main board;

a stack structure on the interposer, the stack structure including a plurality of first semiconductor chips that are vertically stacked; and a second semiconductor chip on the interposer and adjacent a side surface of the stack structure, wherein each of the first semiconductor chips includes:

a semiconductor substrate including a main region on a central area of the first semiconductor chip and an edge region that surrounds the main region;

a first dielectric layer, a second dielectric layer, and a third dielectric layer that are sequentially stacked on a top surface of the semiconductor substrate;

an upper main pad on the top surface of the semiconductor substrate on the main region;

a lower main pad on a bottom surface of the semiconductor substrate on the main region;

an upper dummy pad on the top surface of the semiconductor substrate on the edge region; and a lower dummy pad on the bottom surface of the semiconductor substrate on the edge region, wherein a thickness of the first dielectric layer and a thickness of the third dielectric layer are greater than a thickness of the second dielectric layer, wherein the second dielectric layer includes a dielectric material having an etch selectivity with respect to the first dielectric layer and the third dielectric layer, and wherein a bottom surface of the upper main pad and a bottom surface of the upper dummy pad are at a higher vertical level than a bottom surface of the second dielectric layer.

20. The semiconductor package of claim 19, wherein the bottom surface of each of the upper main pad and the upper dummy pad is at a lower vertical level than a top surface of the second dielectric layer.

* * * * *